United States Patent
Ochotorena, Jr. et al.

(10) Patent No.: US 10,866,275 B2
(45) Date of Patent: Dec. 15, 2020

(54) AUTOMATIC TEST EQUIPMENT (ATE) CONTACTOR ADAPTOR

(71) Applicant: TEXAS INSTRUMENTS INCORPORATED, Dallas, TX (US)

(72) Inventors: Raymond Joseph Ochotorena, Jr., Vail, AZ (US); Kevin Brady, Tucson, AZ (US); William Edward Brumley, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 178 days.

(21) Appl. No.: 16/135,602

(22) Filed: Sep. 19, 2018

(65) Prior Publication Data
US 2020/0088787 A1 Mar. 19, 2020

(51) Int. Cl.
*G01R 31/28* (2006.01)
*G01R 31/319* (2006.01)
*G01R 1/073* (2006.01)
*G01R 31/69* (2020.01)

(52) U.S. Cl.
CPC ..... *G01R 31/2889* (2013.01); *G01R 1/07328* (2013.01); *G01R 31/31915* (2013.01); *G01R 31/69* (2020.01)

(58) Field of Classification Search
CPC .............. G01R 31/69; G01R 31/31915; G01R 1/07328
See application file for complete search history.

(56) References Cited

U.S. PATENT DOCUMENTS

| | | | |
|---|---|---|---|
| 8,159,251 B2 * | 4/2012 | Sasaki ................ | G01R 1/07314 324/754.07 |
| 2012/0217988 A1 * | 8/2012 | Dickson ............ | G01R 1/07371 324/756.05 |
| 2013/0063184 A1 * | 3/2013 | Liang .................. | H01L 21/8213 327/108 |
| 2013/0135001 A1 * | 5/2013 | Breinlinger ........ | G01R 1/07342 324/754.03 |
| 2016/0341790 A1 * | 11/2016 | Thompson ......... | G01R 31/2889 |
| 2020/0141980 A1 * | 5/2020 | Kim .................... | G01R 31/2601 |

* cited by examiner

*Primary Examiner* — Christopher E Mahoney
(74) *Attorney, Agent, or Firm* — John R. Pessetto; Charles A. Brill; Frank D. Cimino

(57) ABSTRACT

An automatic test equipment (ATE) contactor adapter compatible with at least one test board. The contactor adapter includes a contactor adapter body having a first side and a second side. The contactor adapter body includes: 1) a first set of contact components disposed on the first side in an arrangement to contact conductive pads of the at least one test board; and 2) a second set of contact components disposed on the second side and coupled to the first set of contact points. The contactor adapter also includes an adapter interface disposed on the contactor adapter body. The adapter interface includes a third set of contact components coupled to the second set of contact components. The ATE contactor adapter is configured to convey signals between a device under test (DUT) and the at least one test board via the first, second, and third sets of contact components.

16 Claims, 19 Drawing Sheets

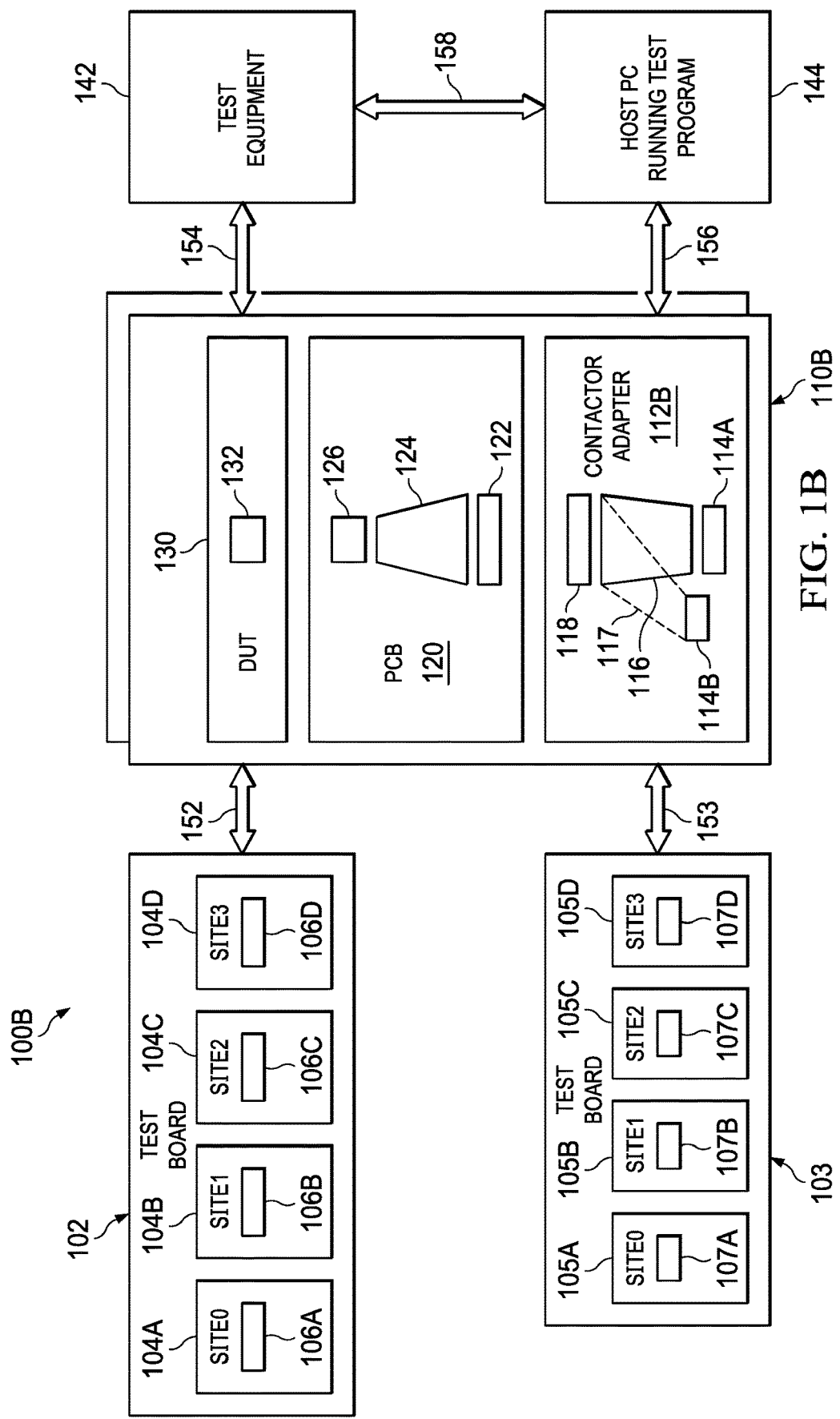

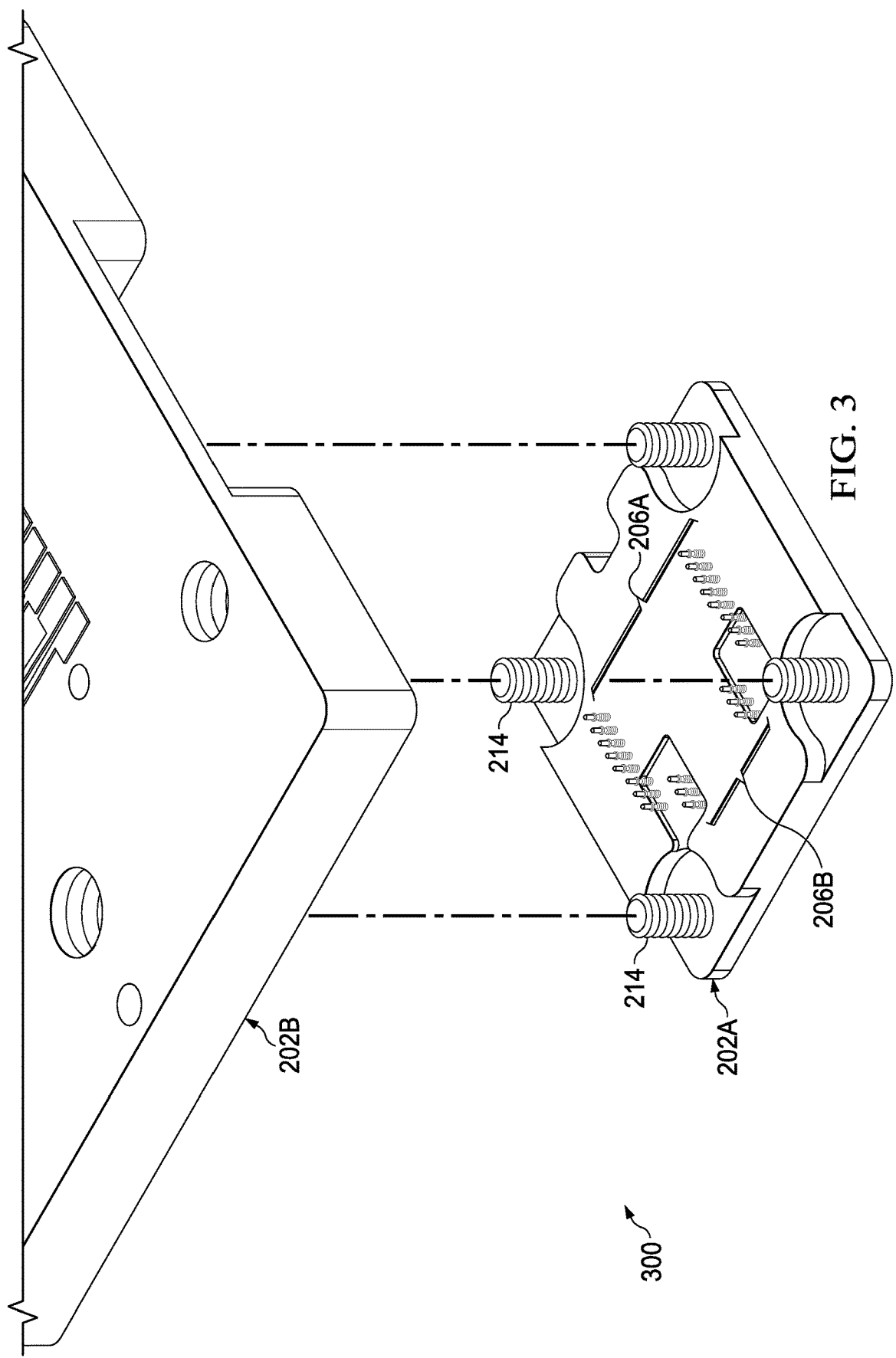

# US 10,866,275 B2

AUTOMATIC TEST EQUIPMENT (ATE) CONTACTOR ADAPTOR

BACKGROUND

As electronic devices and related components are manufactured, new advances are discovered and new challenges are encountered. The process of commercializing an electronic device or component often involves multiple iterations of design, manufacturing, testing, and updating. Even after a product (e.g., a device or component) is released, efforts to improve the product continue in response customer feedback and/or identified issues.

The process of testing a product often involves specialty equipment such as automatic test equipment (ATE). In an example ATE scenario, a packaged or unpackaged integrated circuit is tested at different points (nodes) to characterize the integrated circuit relative to a target design. The test results are used in different ways such as determining that a product is ready to release, updating an integrated circuit design, and/or tracking performance changes in an integrated circuit over time. If specialty equipment and/or a test routine is not available, the process of testing products and related commercialization projects is delayed. Unfortunately, such delays are common. Efforts to reduce commercialization delays and cost are ongoing.

SUMMARY

In accordance with at least one example of the disclosure, an automatic test equipment (ATE) contactor adapter compatible with at least one test board comprises a contactor adapter body having a first side and a second side. The contactor adapter body comprises a first set of contact components disposed on the first side in an arrangement to contact conductive pads of the at least one test board. The contactor adapter body also comprises a second set of contact components disposed on the second side and coupled to the first set of contact points. The ATE contactor adapter also comprises an adapter interface disposed on the contactor adapter body. The adapter interface comprises a third set of contact components coupled to the second set of contact components. The contactor ATE adapter is configured to convey signals between a device under test (DUT) and a compatible test board via the first, second, and third sets of contact components.

In accordance with at least one example of the disclosure, an ATE contactor adapter compatible with at least one test board comprises a first retainer component having a first set of holes that extend from a first side to a second side of the first retainer component. The ATE contactor adaptor also comprises a second retainer component having a second set of holes on a first side and a set of conductive pads on a second side of the second retainer component. The first and second retainer components are joined such that the second side of the first retainer component faces the first side of the second retainer component with the first and second sets of holes in alignment. The ATE contactor adapter also comprises a set of conductive pins held within the first and second sets of holes in alignment, wherein the set of conductive pins couple to the set of conductive pads and is in an arrangement to contact a conductive pad layout for the at least one test board. The ATE contactor adaptor also comprises an adaptor interface disposed on the second side of the second retainer component, wherein the adapter interface comprises a set of contact components coupled to the set of conductive pads. The ATE contactor adapter is configured to convey signals between a DUT and a compatible test board via the set of conductive pins, the set of conductive pads, and the set of contact components.

In accordance with at least one example of the disclosure, an ATE contactor adapter compatible with at least one test board comprises a pin retainer and a set of pins held by the pin retainer. Each pin has an exposed end and an unexposed end, wherein the exposed ends of the pins are in an arrangement to contact a conductive pad layout for the at least one test board. The ATE contactor adapter also comprises an adapter interface disposed on the pin retainer, wherein the adapter interface couples to the pins and provides contact components for a printed circuit board (PCB). The ATE contactor adapter is configured to convey signals between a DUT on a PCB and a compatible test board via the set of pins and the contact components.

BRIEF DESCRIPTION OF THE DRAWINGS

For a detailed description of various examples, reference will now be made to the accompanying drawings in which:

FIGS. 1A and 1B show block diagrams of automatic test equipment (ATE) systems in accordance with various examples;

FIG. 3 shows a perspective view of ATE contactor adapter assembly details in accordance with some examples;

DETAILED DESCRIPTION

Figure 1A:
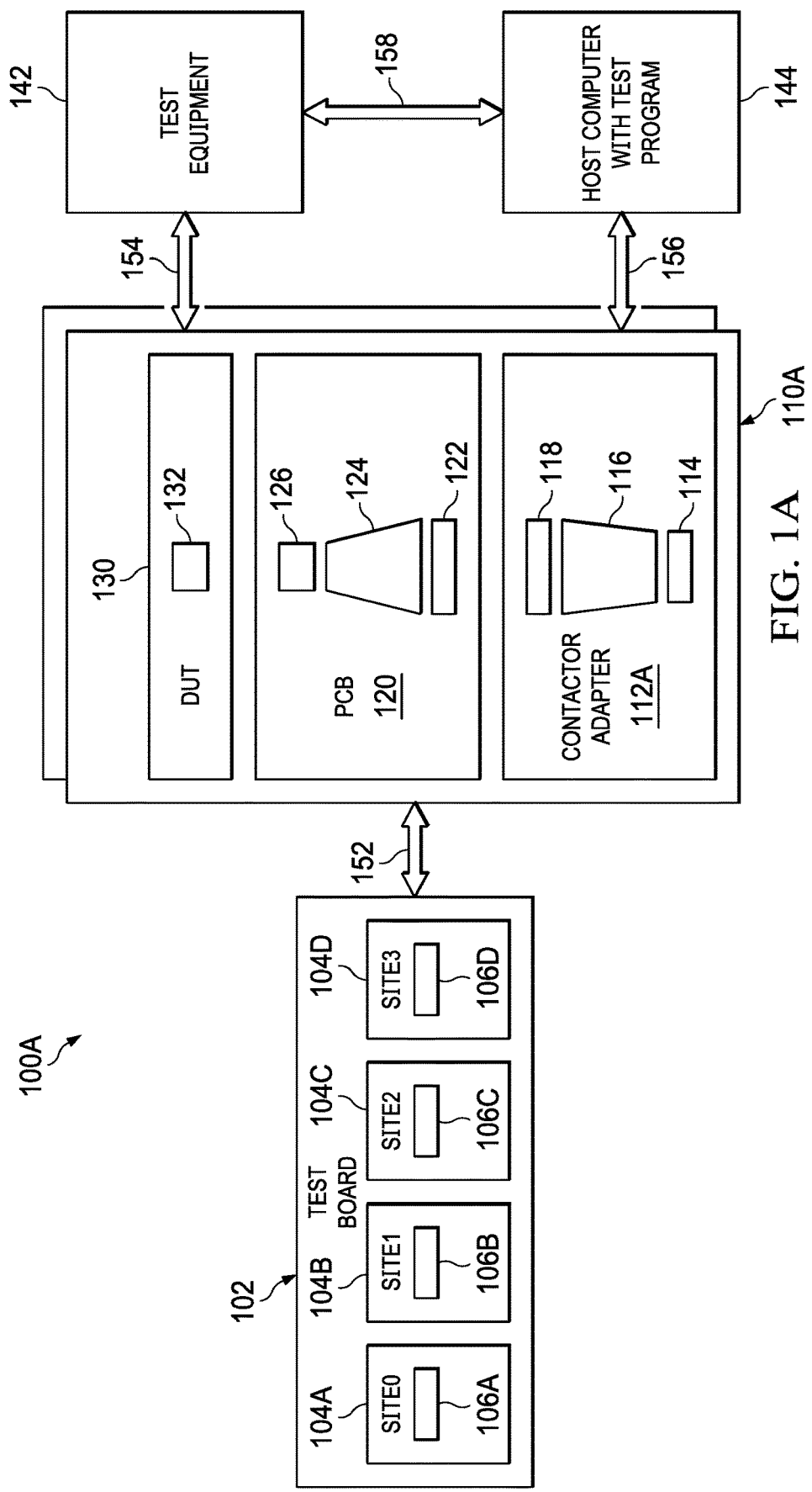

The disclosed examples are directed to automatic test equipment (ATE) contactor adapters and related options, components, and scenarios. The disclosed ATE contactor adapters enable signaling between a test board and a device under test (DUT), where the test board is designed for a different device and/or otherwise lacks a contactor for a given device to be tested. In some examples, an ATE contactor adapter is compatible with different test boards having different conductive pad layouts. As used herein, a "conductive pad layout" refers to a plurality of spaced conductive contact points (e.g., surfaces). As an example, a conductive pad layout includes a plurality of spaced conductive contact points arranged in one or more rows.

To perform DUT operations, an ATE contactor adapter is coupled to an available test board having a conductive pad layout, where the ATE contactor adapter includes a first set of contact components (e.g., conductive pins) in an arrangement to contact the pads of the test board's conductive pad layout. In some examples, the set of contact components are part of or are held by a contactor adapter body (referred to as a "retainer" for some examples), where the contactor adapter body also includes a second set of contact components (e.g., conductive pads) on another side of the contactor adapter body and coupled to the first set of contact components.

In some examples, the ATE contactor adapter also includes an adapter interface disposed on the contactor adapter body, where the adapter interface includes a third set of contact components coupled to the second set of contact components on the contactor adapter body. In some examples, the third set of contact components correspond to contacts for a plug or slot, where a device to be tested couples to the third set of contact components indirectly (e.g., the device is on a printed circuit board (PCB) or "coupon board" that plugs into the adapter interface). Thus, in some examples, DUT operations involve signals being conveyed between the DUT and the test board via the first, second, and third sets of contact components, where the DUT indirectly couples to the adapter interface.

In some examples, the first set of contact components corresponds to pins retained by the contactor adapter body, where each pin has an exposed end configured to contact a conductive pad of a test board. In some examples, each pin corresponding to the first set of contact components includes or is coupled to a tension component that biases a position of the pin. In some examples, the tension components are used to bias the exposed end of each pin towards an exposed position so that when the contactor adapter body is aligned with and disposed on a test board, each pin presses against the test board (facilitating pin contact with conductive pads on the test board regardless of slight default position offsets).

In some examples, the first set of contact components are in an arrangement to contact conductive pads of at least two different test boards with different conductive pad layouts. In such case, an example arrangement includes spaced rows of contact components for each conductive pad layout, where the spaced rows of contact components for each different test board are offset from each other. In some examples, a specialized material (e.g., Arlon N85) is used for the contactor adapter body to facilitate manufacturing, assembly, durability, and use in an ATE environment. To provide a better understanding, various ATE contactor adapter options, assembly options, and related DUT scenarios are described using the figures as follows.

FIGS. 1A and 1B show block diagrams of ATE systems in accordance with various examples. In FIG. 1A, the ATE system 100A comprises a test board 102 with a plurality of test sites 104A-104D, where each of the test sites 104A-104D comprises a respective conductive pad layout 106A-106D. In a standard DUT scenario, each of the test sites 104A-104D would include a contactor that provides a signaling interface between each respective conductive pad layout 106A-106D and a particular DUT. However, in the ATE system 100A, such contactors are not used (e.g., a test board with contactors compatible with a contact layout 132 for the DUT 130 represented in FIG. 1 is not available). Accordingly, to enable signaling between the DUT 130 and the test board 102, the ATE system 100A comprises a DUT interface assembly 110A that includes an ATE contactor adapter 112A and a PCB 120, where the PCB 120 includes a contactor 126 compatible with a contact layout 132 for the DUT 130.

More specifically, the ATE contactor adapter 112A includes a first set of contact components 114 in an arrangement to contact one of the conductive pad layouts 106A-106D. When the ATE contactor adapter 112A is disposed on the test board 102 (e.g., at one of the test sites 104A-104D), the first set of contact components 114 contact the conductive pads of one of the conductive pad layouts 106A-106D. In some examples, the first set of contact components 114 comprises a set of conductive pins retained by a contactor adapter body. In other examples, first set of contact components 114 corresponds to other conductive nodes configured to contact conductive pads of one of the conductive pad layouts 106A-106D. The ATE contactor adapter 112A also comprises a set of contact components 118 associated with an adapter interface. In some examples, the set of contact components 118 corresponds to plug or slot contacts (e.g., part of a male or female arrangement). Between the first set of contact components 114 and the set of contact components 118 is a network of connectors 116 (e.g., traces, one or more sets of conductive pads, leads, wires, etc.) to connect individual contact components of the set of contact components 118 to respective contact components of the first set of contact components 114.

In the example of FIG. 1A, the PCB 120 comprises a set of contact components 122 compatible with the set of contact components 118 of the ATE contactor adapter 112A. When the PCB 120 is joined with the ATE contactor adapter 112A, the set of contact components 122 couple to the set of contact components 118. As previously noted, the PCB 120 comprises a contactor 126 compatible with the contact layout 132 of the DUT 130. Also, the contactor 126 couples to the set of contact components 122 via a network of connectors 124 (e.g., traces, one or more sets of conductive pads, wires, etc.).

To perform DUT operations, the ATE contactor adapter 112A is disposed on the test board 102, the PCB 120 couples to the contactor adaptor 112A, and the DUT 132 couples to the contactor 126. Subsequently, DUT operations involves signaling between the DUT interface assembly 110A, the test board 102, test equipment 142, and/or a host computer 144 running a test program, where the signaling and/or test operations are represented by arrows 152, 154, 156, and 158. In some examples, DUT operations involve multiple DUT interface assemblies 110A, each with a respective DUT and each coupled to a respective test site (one of the test sites 104A-104D) of the test board 102. In different examples, the DUT interface assembly 110A varies with regard the specific components and/or the arrangement of components used for the ATE contactor adapter 112A, the PCB 120, and the contactor 126. Such variations are due to differences in DUTs, contact layouts, connectors, PCBs, retainers, and contacts, etc.

In FIG. 1B, the ATE system 100B comprises the same components as the ATE system 100A of FIG. 1A, except that the ATE contactor adapter 112B is compatible with multiple test boards 102 and 103 with different conductive pads layouts. More specifically, the conductive pad layouts 107A-107D for the test sites 105A-105D of the test board 103 are different than the conductive pad layouts 106A-106D for the test sites 104A-104D of the test board 102. Example differences include the number of conductive pads, the arrangement of conductive pads, and/or the spacing between the conductive pads.

For compatibility with both test boards 102 and 103, the ATE contactor adapter 112B includes a first set of contact components with two sub-sets 114A and 114B. More specifically, the sub-set of contact components 114A is compatible with each of the conductive pad layouts 106A-106D of the test board 102. Meanwhile, the sub-set of contact components 114B is compatible with each of the conductive pad layouts 107A-107D of the test board 103. Thus, as desired, the DUT interface assembly 110B for the ATE system 100B is usable with either of the test boards 102 and 103. In some examples, different networks of connectors 116 and 117 are used to couple the two sub-sets of contact components 114A and 114B to the second set of contact components 118. In other examples, the different networks of connects 116 and 117 have some overlapping components such that at least some of the second set of contact components 118 are used with both of the sub-sets of contact components 114A and 114B.

To perform DUT operations, the ATE contactor adapter 112B is disposed on either of the test boards 102 and 103, the PCB 120 couples to the contactor adaptor 112B, and the DUT 132 couples to the contactor 126. Subsequently, DUT operations involve signaling between the DUT interface assembly 110B, one of the test boards 102 and 103, test equipment 142, and/or a host computer 144 running a test program, where the signaling and/or test operations are represented by arrows 152, 153, 154, 156, and 158. In some examples, DUT operations involve multiple DUT interface assemblies 110B, each with a respective DUT and each coupled to a respective test site (one of the test sites 104A-104D or 105A-105D) of one of the test boards 102 and 103. In different examples, the DUT interface assembly 110B varies with regard the specific components and/or arrangement of components used for the ATE contactor adapter 112B, the PCB 120, and the contactor 126. Such variations are due to differences in DUTs, contact layouts, connectors, PCBs, retainers, and contacts, etc.

Figure 2:
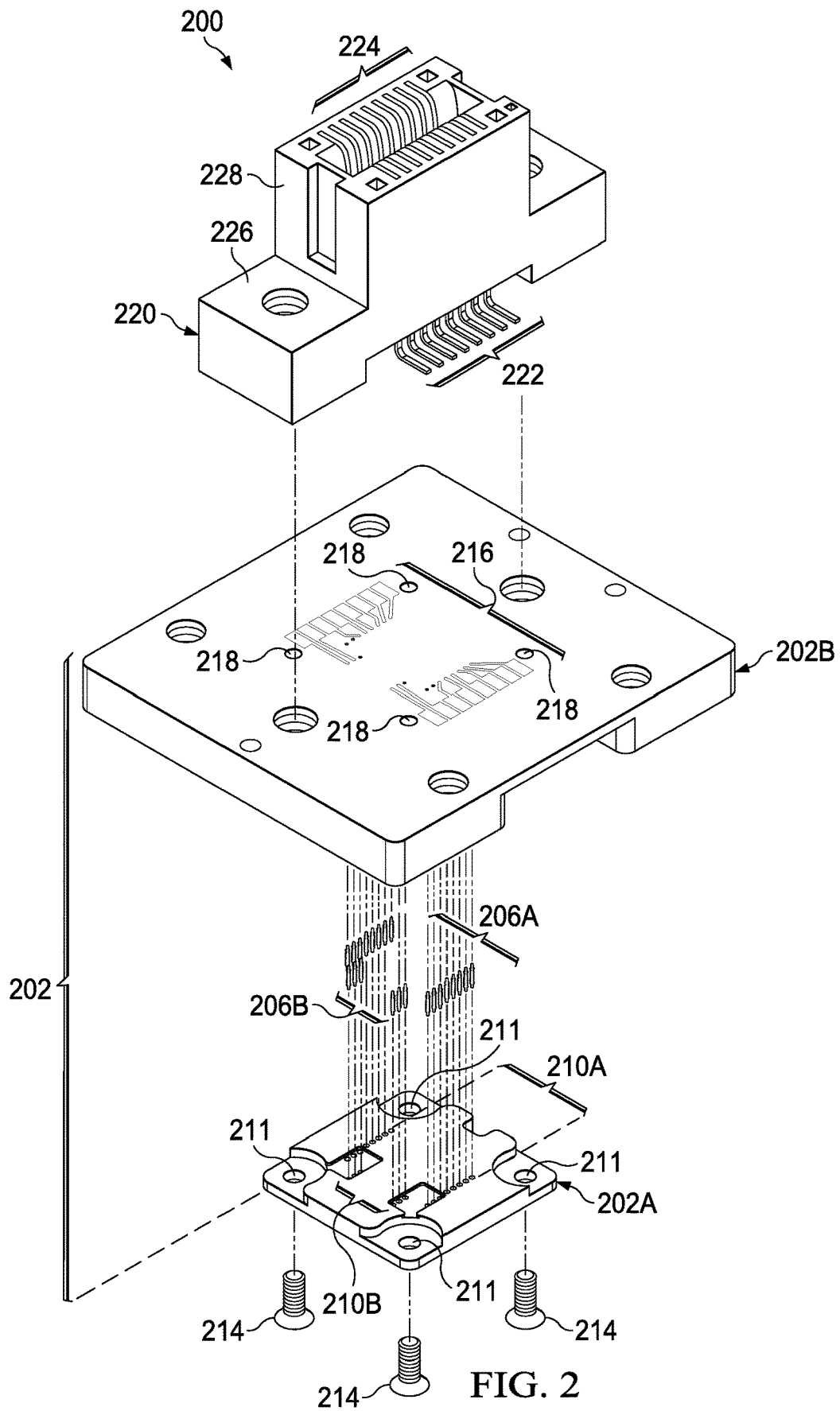
FIG. 2 shows a perspective view of an ATE contactor adapter before assembly in accordance with various examples.

FIG. 2 shows a perspective view of an ATE contactor adapter 200 before assembly in accordance with various examples. The ATE contactor adapter 200 of FIG. 2 is an example of the ATE contactor adapter 112B in FIG. 1B, where the ATE contactor adapter 200 is compatible with different test boards (e.g., test boards 102 and 103 in FIG. 1B). In the example of FIG. 2, the ATE contactor adapter 200 comprises a contactor adapter body 202 (corresponding to a pin retainer in the example of FIG. 2) with a first component 202A and a second component 202B. The first component 202A includes sub-sets of holes 210A and 210B to receive respective sub-sets of pins 206A and 206B. In some examples, the sub-sets of pins 206A and 206B correspond to the sub-sets of contact components 114A and 114B in FIG. 1B. The first component 202A also includes screw holes 211.

As shown, the second component 202B includes a set of conductive pads 216. In some examples, the set of conductive pads 216 is part of the network of connectors 116 and/or 117 in FIG. 1B. While not visible in FIG. 2, the second component 202B includes sub-sets of holes (see e.g., FIG. 8A) to receive the respective sub-sets of pins 206A and 206B. When the first and second components 202A and 202B of the contactor adapter body 202 are joined (e.g., by fastening the screws 214 through the screw holes 211 in the first component 202A and into threaded screw holes 218 in the second component 202B) with the sub-sets of pins 206A and 206B in place, each pin of the sub-sets of pins 206A and 206B couples to a respective pad in the set of conductive pads 216. In some examples, coupling the sub-sets of pins 206A and 206B to respective pads in the set of conductive pads 216 involves use of plated holes, traces, and/or connectors (which correspond to the networks of connectors 116 and 117 in FIG. 1B). Also, each pin of the sub-sets of pins 206A and 206B has an exposed end and an unexposed end. In the view provided in FIG. 2, the unexposed ends for the sub-sets of pins 206A and 206B will be enclosed in the second component 202B once assembly is complete. Meanwhile, the exposed ends for the sub-sets of pins 206A and 206B will protrude from the underside of the first component 202A once assembly is complete. In some examples, each pin of the sub-sets of pins 206A and 206B couples to or includes a tension component (e.g., a spring) to bias each pin towards a default position while providing some play to facilitate good contact between each pin and respective pads on a test board when an assembled version of the ATE contactor adapter 200 is disposed on a test board. In some examples, each pin of the sub-sets of pins 206A and 206B is a pogo pin. In different examples, different types of pogo pins are used.

As shown, the ATE contactor adapter 200 also comprises an adapter interface 220 with a set of contacts 224. In some examples, the set of contacts 224 corresponds to the second set of contact components 118 in FIG. 1B. Meanwhile, any other conductive components of the adapter interface 220 between the set of contacts 224 and the set of conductive pads 216 of the second component 202B of the contactor adapter body 202 is part of the network of connectors 116 and/or 117 FIG. 1B. In some examples, the adapter interface 220 includes a base portion 226 with a set of conductive leads 222 coupled to the set of contacts 224. When assembly of the ATE contact adapter 200 is complete, the set of conductive leads 222 contact the set of conductive pads 216 on the second component 202B of the contactor adapter body 202 (only eight of sixteen leads in the set of conductive leads 222 are visible in FIG. 2). In some examples, the set of conductive leads 222 are soldered to the set of conductive pads 216. Also, it should be noted that the set of contacts 224 in the plug portion 228 includes sixteen contacts.

For the ATE contactor adapter 200 of FIG. 2, six of pads in the set of conductive pads 216 couple to the sub-set of pins 206B as well as to six of the pins in the sub-set of pins 206A. Thus, in some examples, the total number of pins in the sub-sets of pins 206A and 206B is greater than the number pads in the set of conductive pads 216. With this arrangement, only one of the sub-sets of pins 206A and 206B is used at a time during DUT operations. For the example ATE contactor adapter 200 of FIG. 2, the sub-set of pins 206A supports DUTs with up to sixteen nodes to be tested, while the sub-set of pins 206B supports DUTs with up to six nodes to be tested. Accordingly, for the example ATE contactor adapter 200 of FIG. 2, there are sixteen pads in the set of conductive pads 216, sixteen leads in the set of conductive leads 222, and sixteen contacts in the set of contacts 224. In other examples, the number of nodes to be tested and related contacts, connectors, etc., varies from the example ATE contactor adapter 200 of FIG. 2 (different ATE contactor adapter versions are possible). Also, in different examples, the adapter interface 220 employs a plug portion 228 with a male arrangement instead of the female arrangement represented in FIG. 2.

As previously noted, the sub-sets of pins 206A and 206B are an example of the first set of contact components 114 in FIG. 1B. Also, the set of contacts 224 in the adapter interface 220 are an example of the set of contact components 118 in FIG. 1B. Meanwhile, the set of conductive pads 216, plated holes, traces, the set of conductive leads 222, and/or other conductive components are examples of the networks of connectors 116 and 117 in FIG. 1B, where the set of conductive pads 216, plated holes, traces, the set of conductive leads 222 and/or other conductive components provide continuity between the sub-sets of pins 206A and 206B and respective contacts of the set of contacts 224 in the adapter interface 220. In other ATE contactor adapters, the first set of contact components 114, the network of connectors 116 and 117, and/or the second set of contact components 118 varies from the example ATE contactor adapter 200 of FIG. 2.

FIG. 3 shows a perspective view of ATE contactor adapter assembly details in accordance with some examples. In FIG. 3, the sub-sets of pins 206A and 206B are represented as being partially inserted into the first component 202A of the contactor adapter body 202 (e.g., the sub-sets of holes 210A and 210B represented in FIG. 2 receive the sub-sets of pins 206A and 206B in FIG. 3). Also, the screws 214 are represented in FIG. 3 as being inserted into respective screw holes in the first component 202A of the contactor adapter body 202 (e.g., the screw holes 211 represented in FIG. 2 receive the screws 214 in FIG. 3). By aligning the first and second components 202A and 202B of the contactor adapter body 202, pressing the first and second components 202A and 202B together, and inserting the screws 214 through respective screw holes 211 in the first component 202A and into the threaded screw holes 218 (see FIG. 2) in the second component 202B, the contactor adapter body 202 retains the sub-sets of pins 206A and 206B.

Figure 4A:
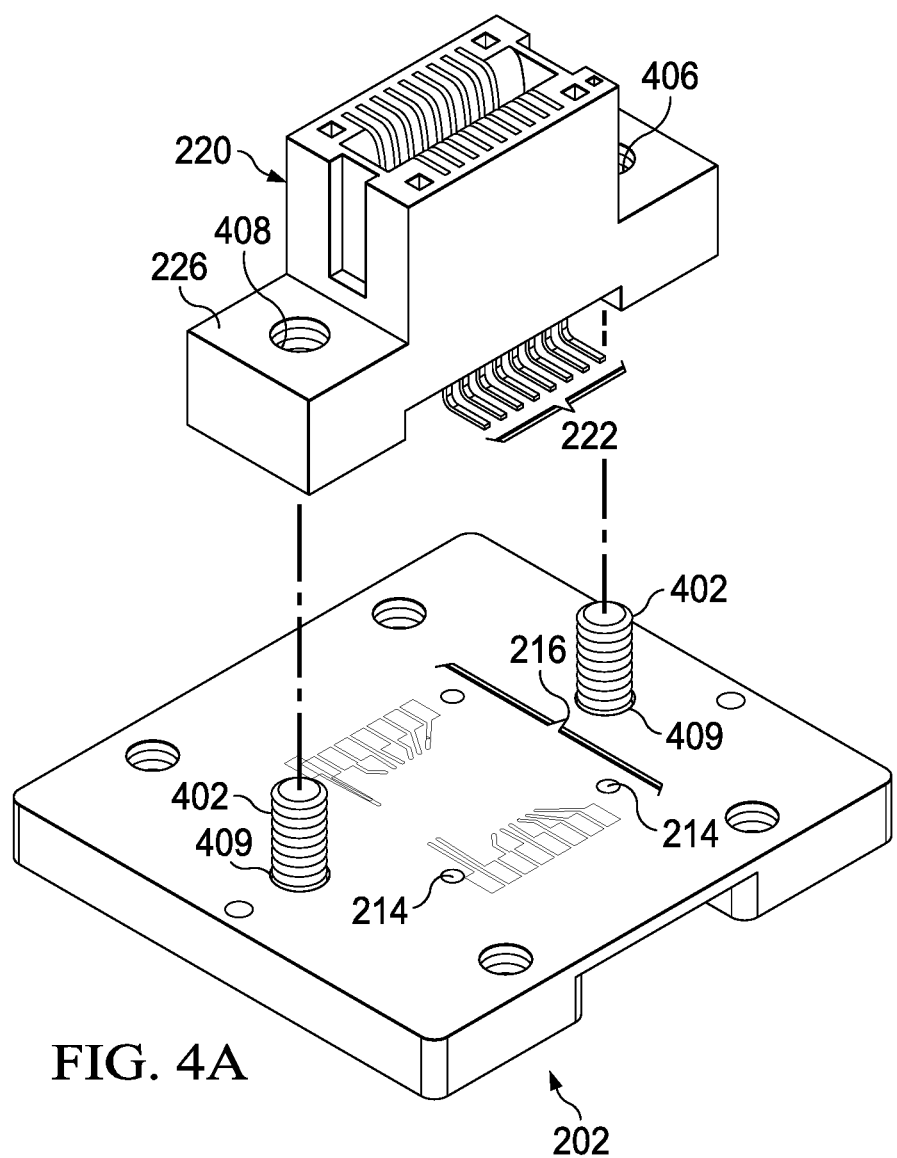
FIGS. 4A and 4B show perspective views of additional ATE contactor adapter assembly details in accordance with various examples.
Figure 4B:
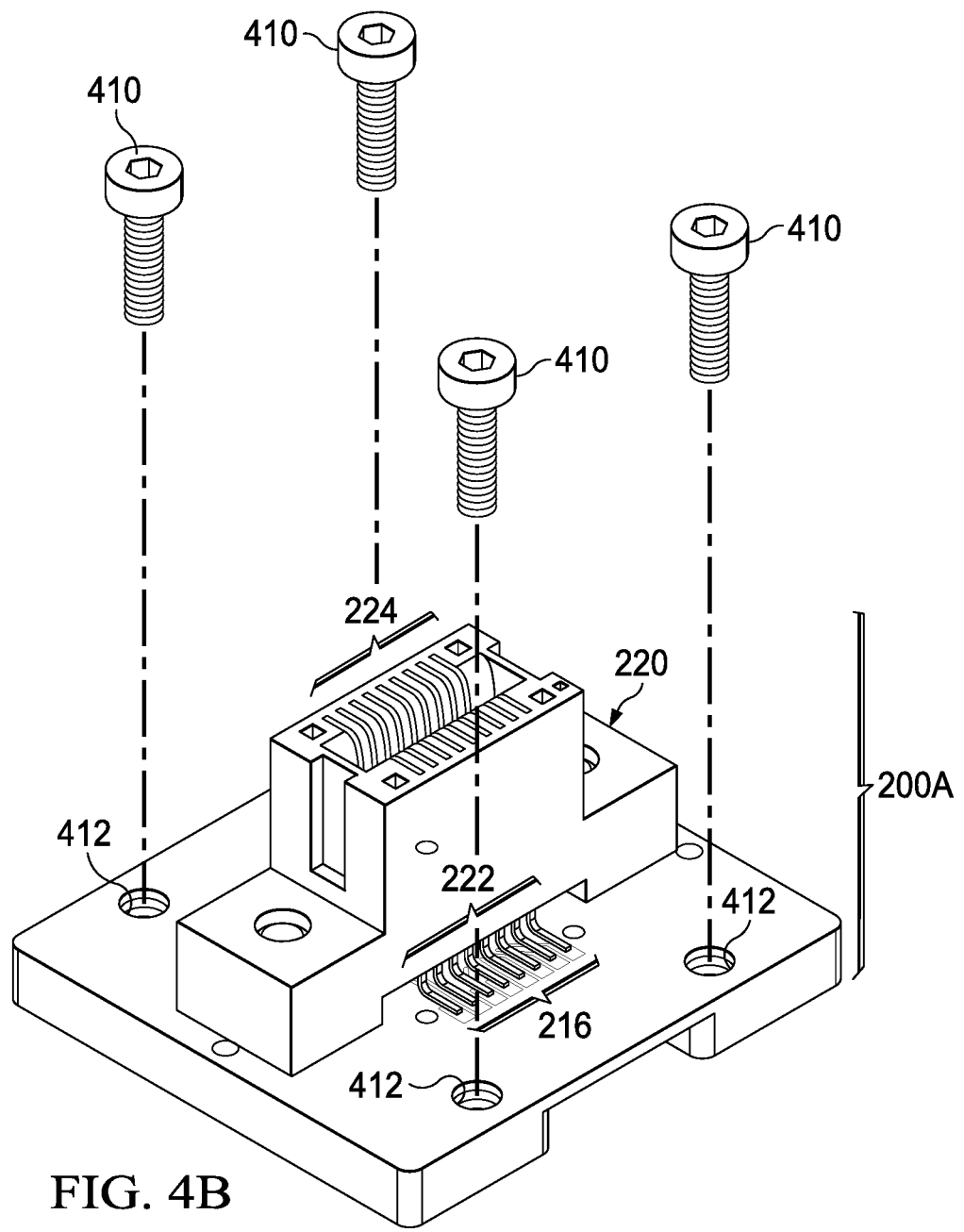

FIGS. 4A and 4B show perspective views of additional ATE contactor adapter assembly details in accordance with various examples. In FIG. 4A, an assembled contactor adapter body 202 is represented (with the sub-sets of pins 206A and 206B retained therein), where the screws 214 used for assembly of the contactor adapter body 202 are flush with the contactor adapter body 202 or otherwise do not interfere with coupling the adapter interface 220 to the contactor adapter body 202. In the examples of FIGS. 4A and 4B, screws 402 are inserted through screw holes 409 in the contactor adapter body 202 and into threaded screw holes 408 in the base 226 of the adapter interface 220. Once the adapter interface 220 is coupled to or otherwise disposed on the contactor adapter body 202, the set of leads 222 included with the adapter interface 220 is soldered to the set of conductive pads 216 on the contactor adapter body 202. FIG. 4B shows the adapter interface 220 coupled to the contactor adapter body 202 (only half of the set of leads 222 and only half of the set of conductive pads 216 are visible in FIG. 4B). With the contactor adapter body 202 assembled and the adapter interface 220 disposed on the contactor adapter body 202, an assembled version 200A of the ATE contactor adapter 200 in FIG. 2 is represented in FIG. 4B. As needed, the assembled ATE contactor adapter 200A is used in a DUT scenario by disposing the assembled ATE contactor adapter 200A on a test board. In some examples, screws 410 are inserted through screw holes in the contactor adaptor body 412 to fasten the assembled ATE contactor adapter 200A to a test board.

Figure 5:
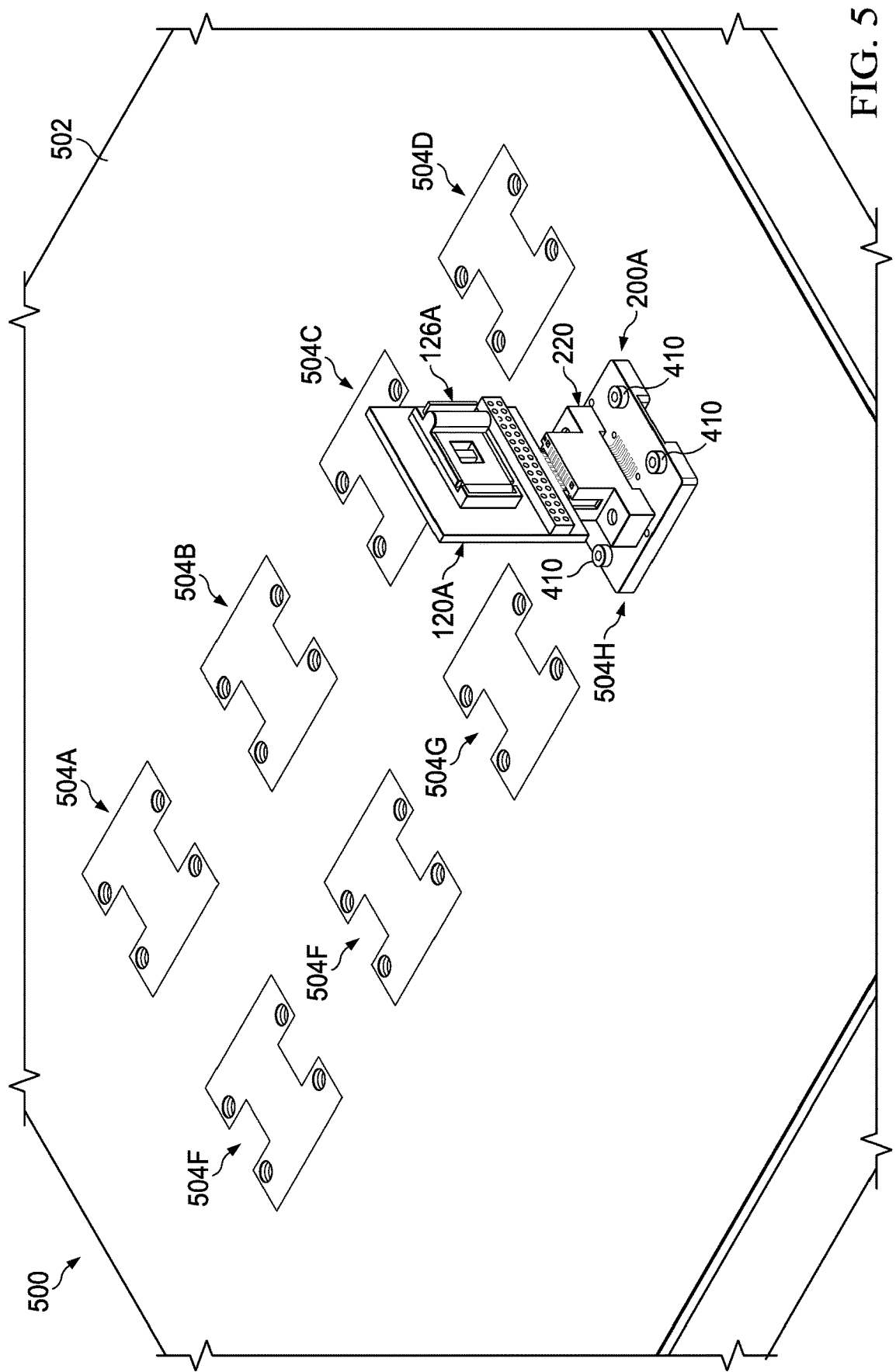
FIG. 5 shows a perspective view of a device under test (DUT) scenario involving an assembled ATE contactor adapter in accordance with various examples.

FIG. 5 shows a perspective view of a DUT scenario 500 involving an assembled ATE contactor adapter 200A in accordance with various examples. As shown in the DUT scenario 500, the assembled ATE contactor adapter 200A is disposed on a test board 502 with test sites 504A-504H. In some examples, the screws 410 represented in FIG. 4B are used to couple the assembled ATE contactor adapter 200A to the test board 502. In different examples, the test board 502 is an example of the test board 102 or 103 in FIG. 1B. The DUT scenario 500 also shows a PCB 120A (an example of the PCB 120 in FIGS. 1A and 1B) with a contactor 126A (an example of the contactor 126 in FIGS. 1A and 1B), where the PCB 120A couples to the adapter interface 220. The contactor 126A holds the DUT 130 in place and provides contacts extending between the DUT 130 and the PCB 120A. The PCB 120A additionally includes conductive pads, traces, contacts, and/or other conductive components to provide continuity between test nodes (e.g., pins) of the DUT 130 and a set of contacts (e.g., the set of contacts 224 in FIGS. 2 and 4B) of the adapter interface 220 for the assembled ATE contactor adapter 200A.

Figure 6A:
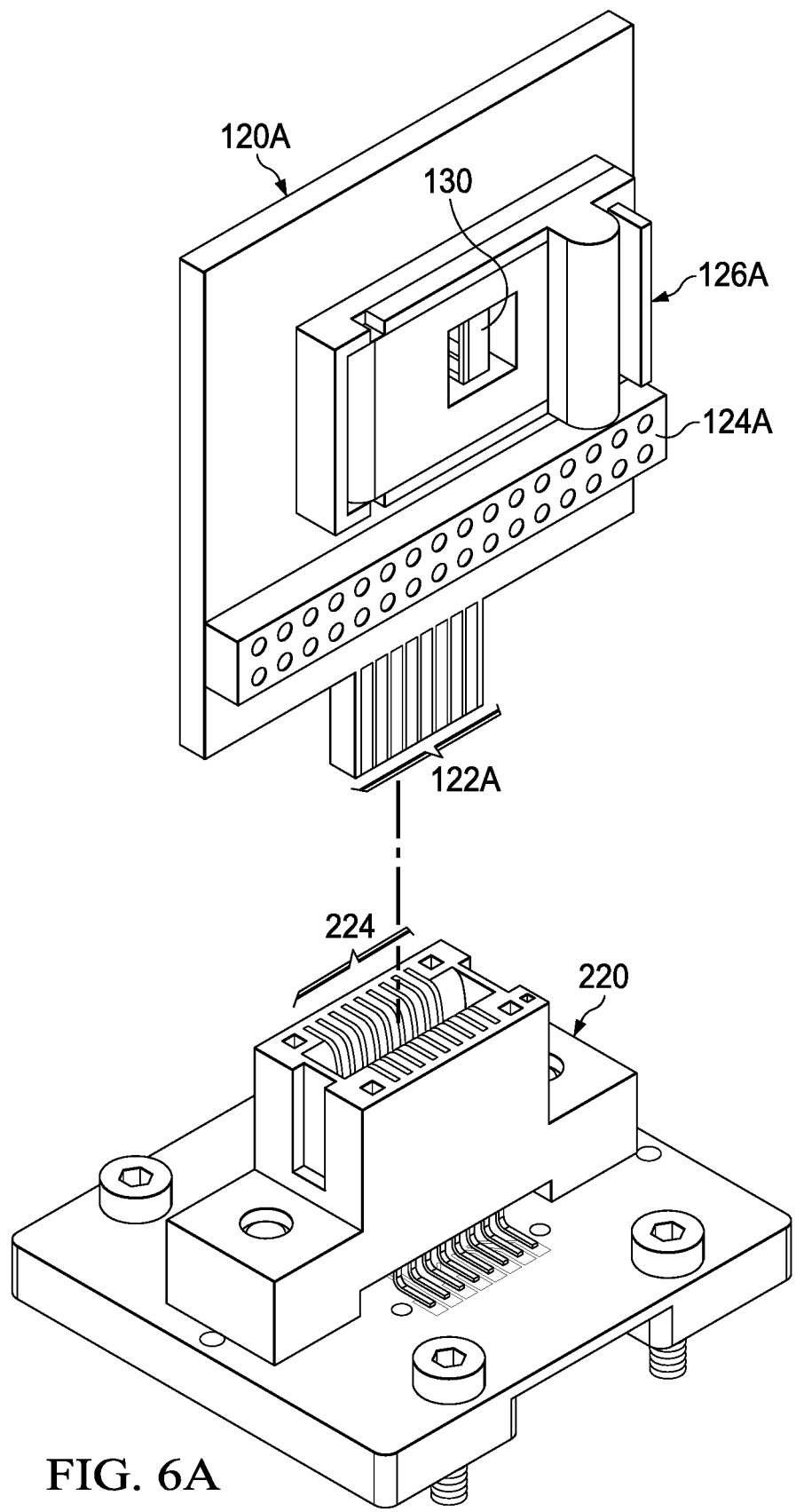
FIGS. 6A and 6B show perspective views of a printed circuit board (PCB) before and after installation in an assembled ATE contactor adapter in accordance with various examples
Figure 6B:
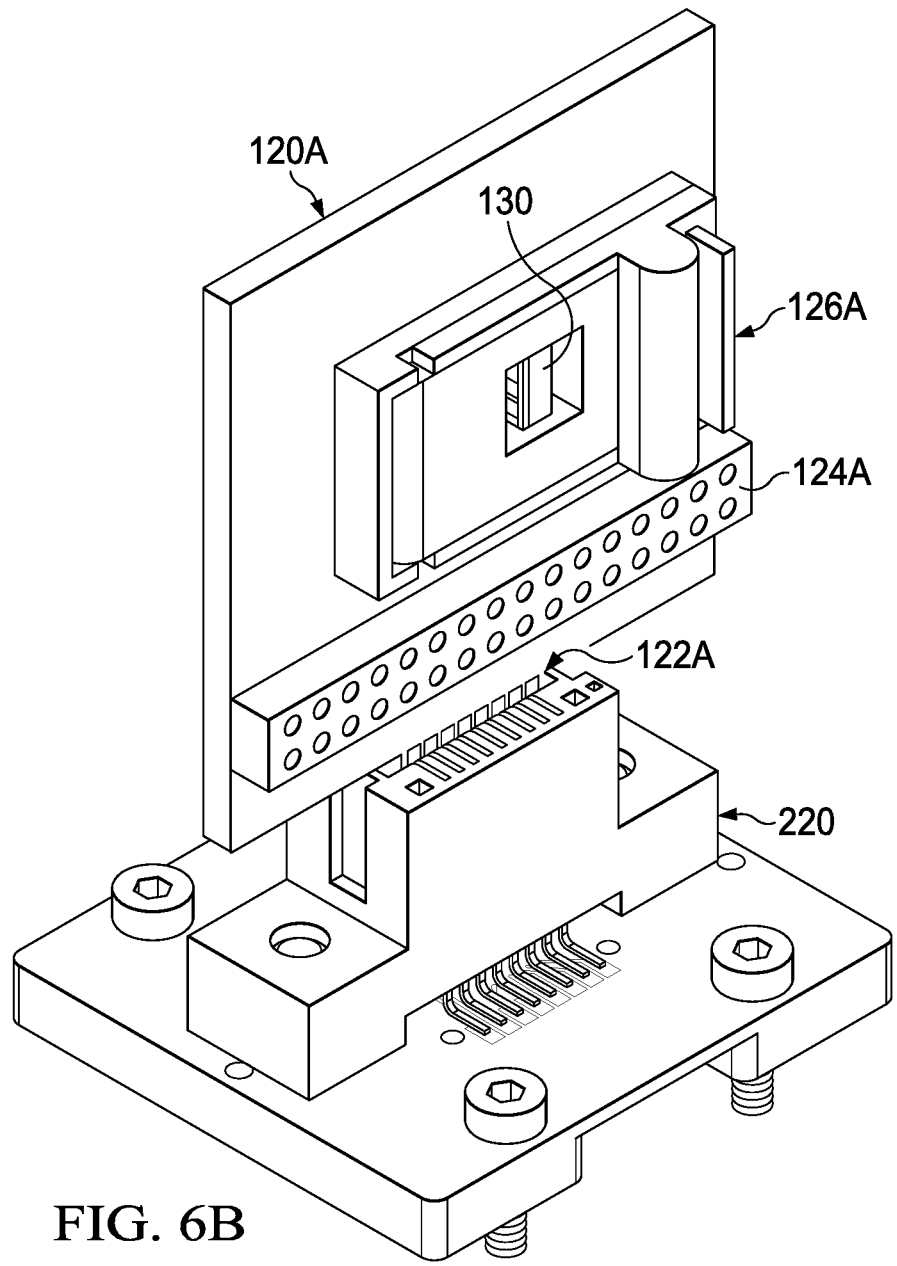

FIGS. 6A and 6B show perspective views of the PCB 120A before and after installation in the assembled ATE contactor adapter 200A in accordance with various examples. In FIG. 6A, half of a set of contact components 122A (an example of the set of contact components 122 in FIGS. 1A and 1B) for the PCB 120A is visible before installation. Also, a connectivity strip 124A (e.g., part of the network of connectors 124 in FIGS. 1A and 1B) for the PCB 120A is represented. In FIG. 6B, the set of contact components 122A are inserted into the adapter interface 220, such that individual contacts of the set of contact components 122A couple to respective contacts of the set of contacts 224 in the adapter interface 220. The various other features labeled in FIGS. 6A and 6B (e.g., the DUT 130 the contactor 126A) were described previously (see e.g., FIG. 5).

Figure 7A:
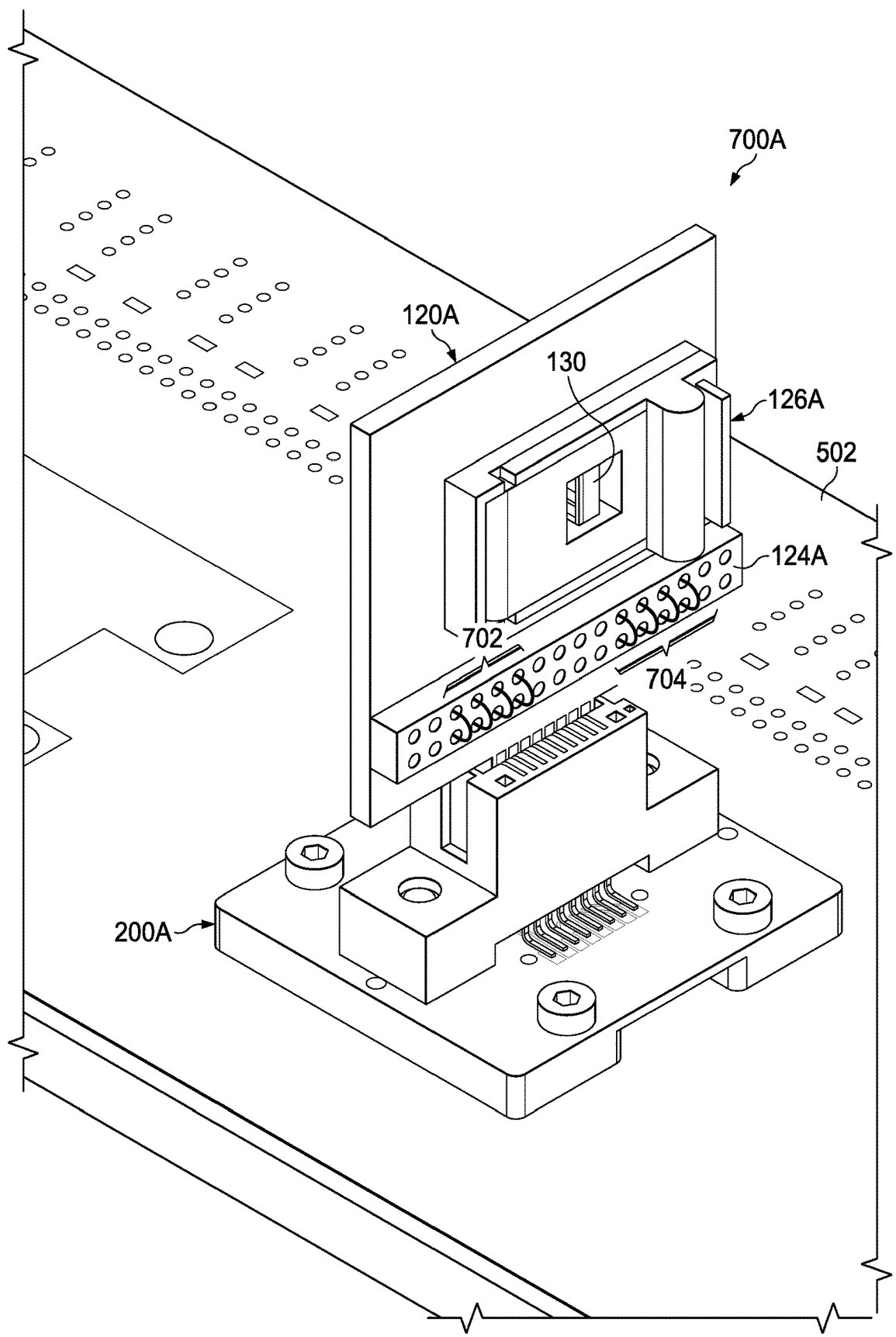
FIGS. 7A and 7B show different DUT scenarios in accordance with various examples.
Figure 7B:
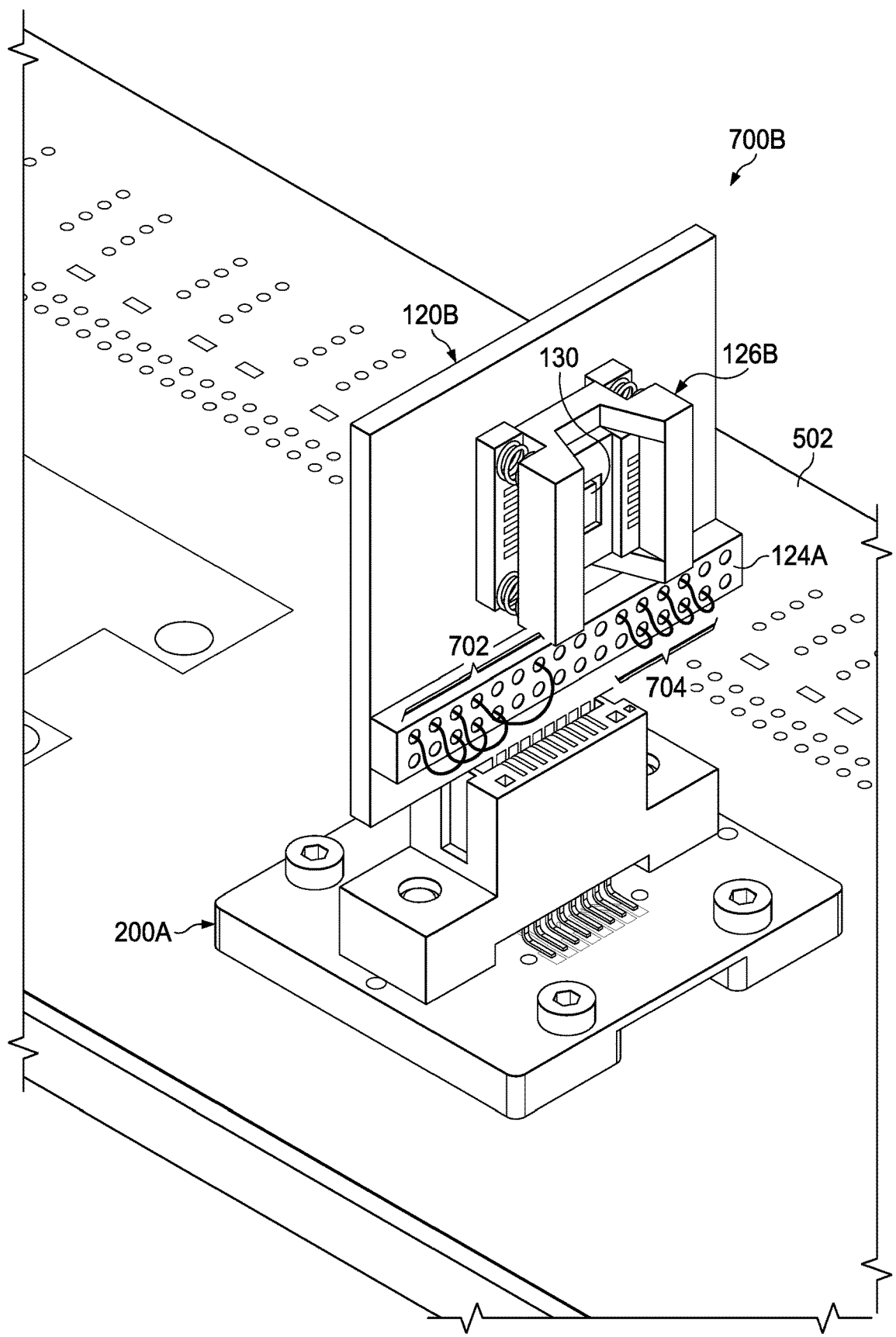

FIGS. 7A and 7B show different DUT scenarios 700A and 700B in accordance with various examples. In the DUT scenario 700A of FIG. 7A, a PCB 120A with the contactor 126A is shown inserted into an assembled ATE contactor adapter 200A disposed on the test board 502. In FIG. 7A, the example contactor 126A uses a hinged latch arrangement to hold the DUT 130 in place. Also, sets of wires 702 and 704 are inserted into different holes of the connectivity strip 124A to connect different test nodes of the DUT 130 to different individual contacts of the set of contact components 122A.

In the DUT scenario 700B of FIG. 7B, a PCB 120B with another type of contactor 126B is shown inserted into an assembled ATE contactor adapter 200A disposed on the test board 502. In FIG. 7B, the example contactor 126B uses a tension-based arrangement to hold the DUT 130 in place (no hinged latch is used). Again, the sets of wires 702 and 704 are inserted into different holes of the connectivity strip 124A to connect different test nodes of the DUT 130 to different individual contacts of the set of contact components 122A.

Figure 8A:
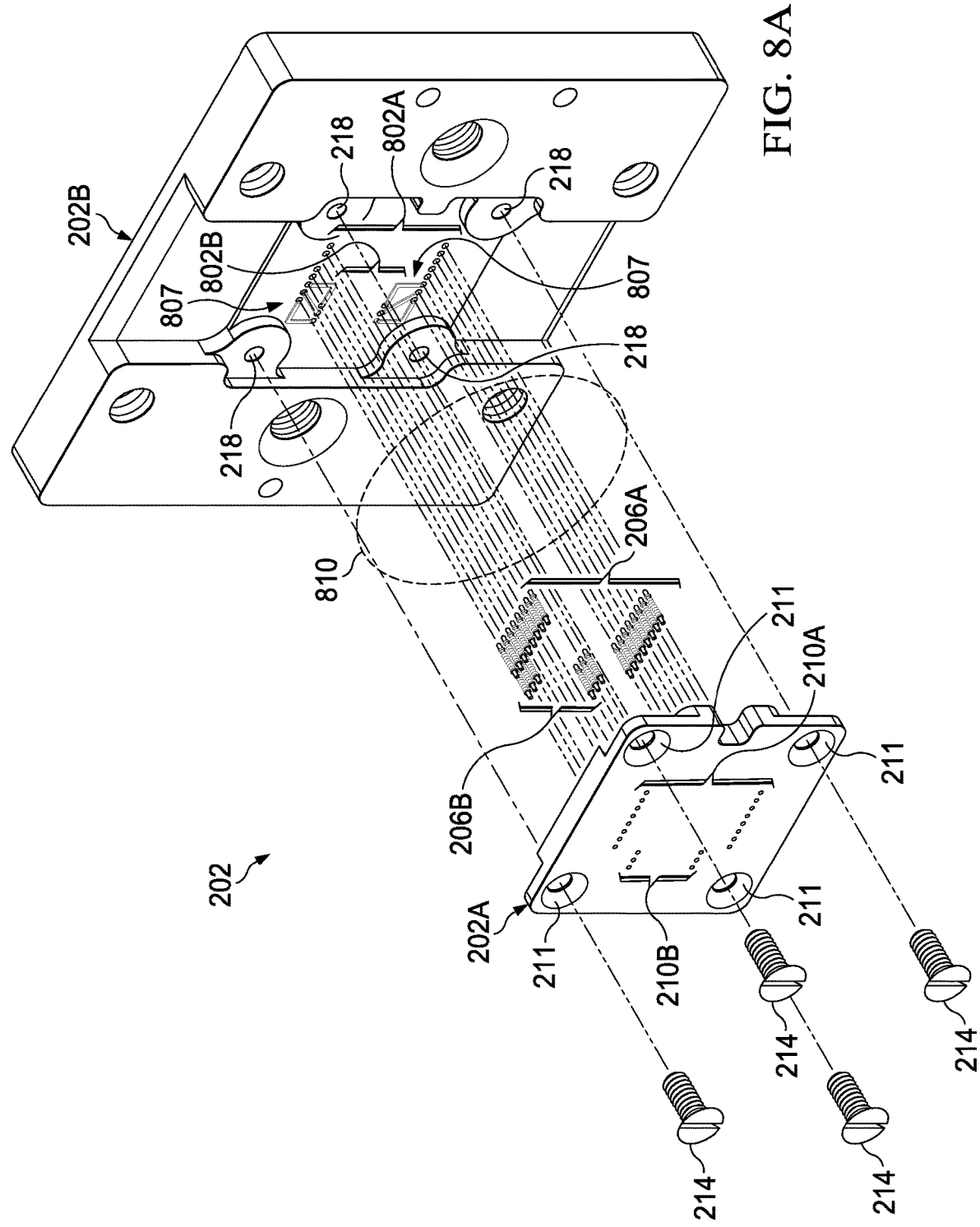
FIGS. 8A and 8B show perspective views of ATE contactor adapter components before assembly in accordance with various examples.
Figure 8B:
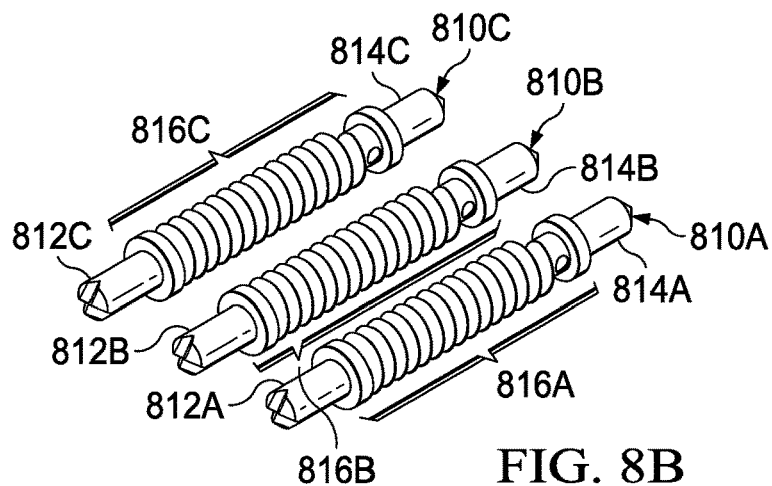

FIGS. 8A, 8B, 9A-9D, and 10A-10F show additional details for components of the example ATE contactor adapter 200 described herein. These additional details are not intended to limit ATE contactor adapters to a particular example. FIGS. 8A and 8B show perspective views of ATE contactor adapter components before assembly. In FIG. 8A, the undersides of the first and second components 202A and 202B of a contactor adapter body 202 are represented (see e.g., FIG. 2). As shown in FIG. 8A, the sub-sets of holes 210A and 210B extend through the first component 202A. Also, the screw holes 211 are shaped to receive countersunk heads for the screws 214. Sub-sets of holes 802A and 802B in the second component 202B are also visible in FIG. 8A along with a set of traces 807 that couple conductive material corresponding to the sub-set of holes 802B (e.g., each hole of the sub-set of holes 802B is plated with a conductive material) to conductive material corresponding to some of the sub-set of holes 802A (e.g., each hole of the sub-set of holes 802A is plated with a conductive material). Various assembly guidelines 810 are also represented in FIG. 8A to show how different components align once assembly is complete.

Meanwhile, FIG. 8B shows a 30:1 scaled view of three pins 810A, 810B, 810C (examples of pins corresponding to the sub-sets of pins 206A and 206B). As shown, each of the pins 810A, 810B, 810C includes a respective end 812A, 812B, 812C with multiple contact points. In some examples, the ends 812A, 812B, and 812C correspond to exposed ends when assembly of an ATE contactor adapter is complete, where the multiple contact points for each of the ends 812A, 812B, 812C facilitate contact with pads on a test board (e.g., the test board 502 of FIG. 5). In some examples, the other ends 814A, 814B, 814C for the pins 810A, 810B, 810C have a conical shape to facilitate contact with conductive material along the sub-sets of holes 802A and 802B in the second component 202B of a contactor adapter body 202. The other ends 814A, 814B, 814C are unexposed or hidden once assembly is complete. Each of the pins 810A, 810B, and 810C also comprises a respective spring 816A, 816B, and 816C to bias the pins 810A, 810B, and 810C in a default position when assembly of the contactor adapter body 202 represented in FIG. 8A is complete. Once assembly is complete, pin ends such as ends 812A, 812B, 812C in FIG. 8B are exposed below the first component 202A (the visible side in FIG. 8A) of the contactor adapter body 202. In other words, pin ends such as ends 812A, 812B, 812C in FIG. 8B protrude from the sub-sets of holes 210A and 210B visible in FIG. 8A to facilitate contact with a test board as described herein.

Figure 9A:
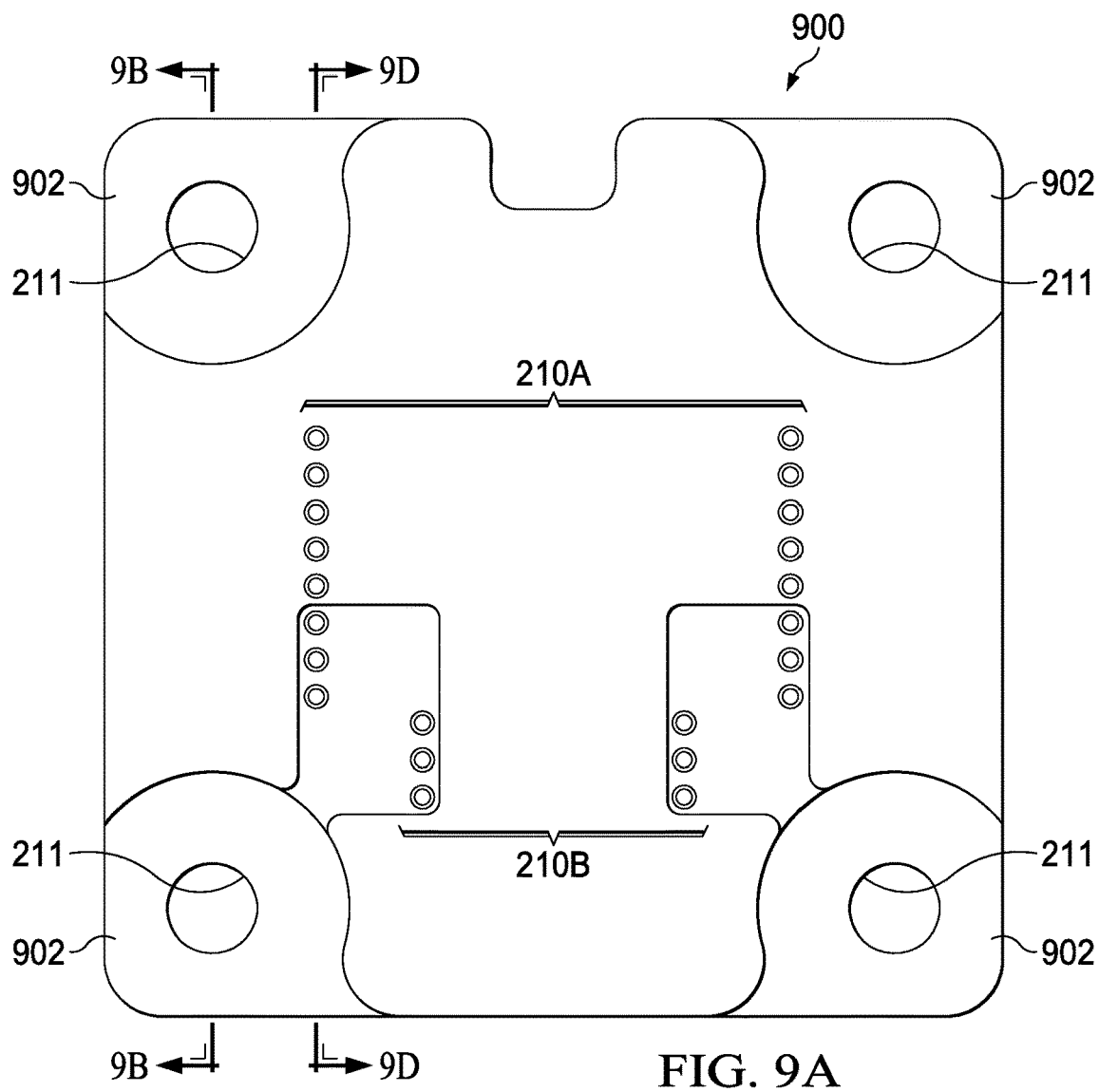
FIGS. 9A-9D show different views of a first pin retainer component for an ATE contactor adapter in accordance with various examples.
Figure 9D:
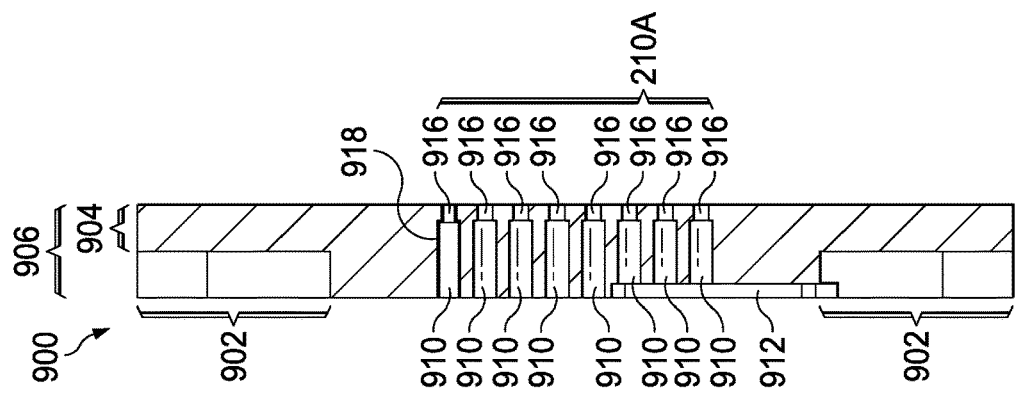
Figure 9C:
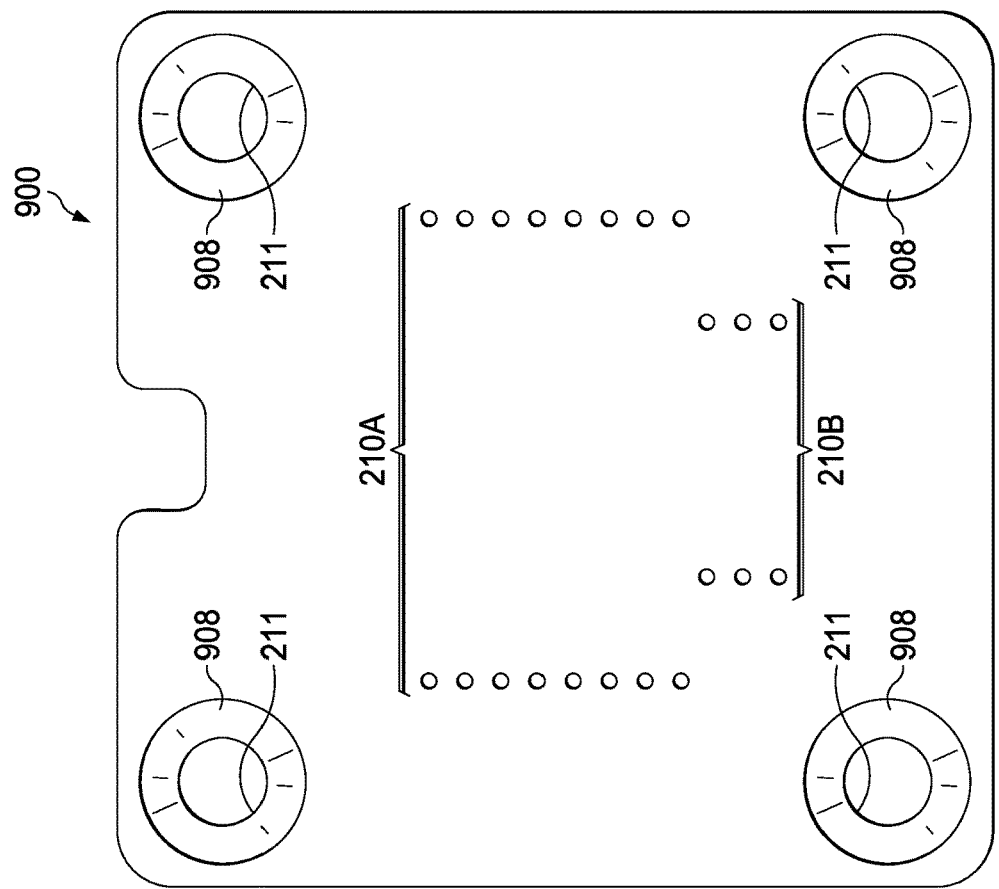
Figure 9B:
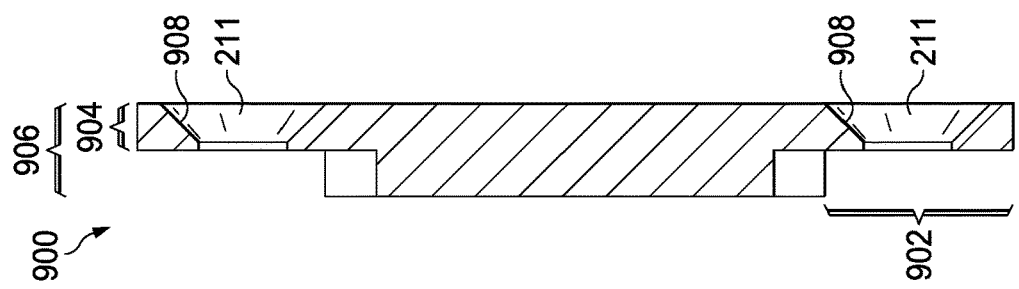

FIGS. 9A-9D show different views of an example first pin retainer component 900 for an ATE contactor adapter (e.g., the ATE contactor adapter 200). The first pin retainer component 900 is an example of the first component 202A of the contactor adapter body 202 in FIGS. 2, 3, and 8A. In FIG. 9A, a top view of the first pin retainer component 900 is represented with the sub-sets of holes 210A and 210B visible. The top view in FIG. 9A shows the side of the first pin retainer component 900 that will contact a second pin retainer component (see e.g., the second pin retainer component 1000 of FIGS. 10A-10F) once assembly is complete. In FIG. 9A, the screw holes 211 are also visible. Around each screw hole 211 is a recessed area 902 with a reduced thickness 904 relative to a default thickness 906 for first pin retainer component 900 (see e.g., the cross-sectional view in FIG. 9B). In FIG. 9B, the shape of the countersunk surfaces 908 for the screw holes 211 are visible.

In FIG. 9C, a bottom view of the first pin retainer component 900 is represented, where the sub-sets of holes 210A and 210B, the screw holes 211, and the countersunk surfaces 908 are visible. The bottom view in FIG. 9C shows the side of the first pin retainer component 900 that will face a test board in a DUT scenario (e.g., the DUT scenario of FIG. 5). In FIG. 5D, a cross-sectional view of the first pin retainer component 900 is represented, where the cross-section intersects a row of the sub-set of holes 210A.

As shown in FIG. 9D, each hole represented includes a first portion 910 with a first diameter and a second portion 916 with a second diameter, where the first diameter is larger than the second diameter. In some examples, each hole of the sub-sets of holes 910A and 910B in the first pin retainer component 900 is plated with a conductive material 918 to facilitate retention and/or electrical continuity between retained pins and conductive pads or traces of a second pin retainer component. Also visible in FIG. 9D is a recessed surface 912. In some examples, the recessed surface 912 helps accommodate traces or other raised surfaces on a second pin retainer component.

FIGS. 10A-10F show different views of an example second pin retainer component 1000 compatible with the first pin retainer component 900 represented in FIGS. 9A-9D. The second pin retainer component 1000 is an example of the second component 202B of the contactor adapter body 202 in FIGS. 2, 4A, 4B, and 8A. In the side view of FIG. 10A, a recessed area 1004 is visible, where the thickness of the second pin retainer component 1000 at the recessed area 1004 is less than a default thickness 1002 for the second pin retainer component 1000.

Figure 10B:
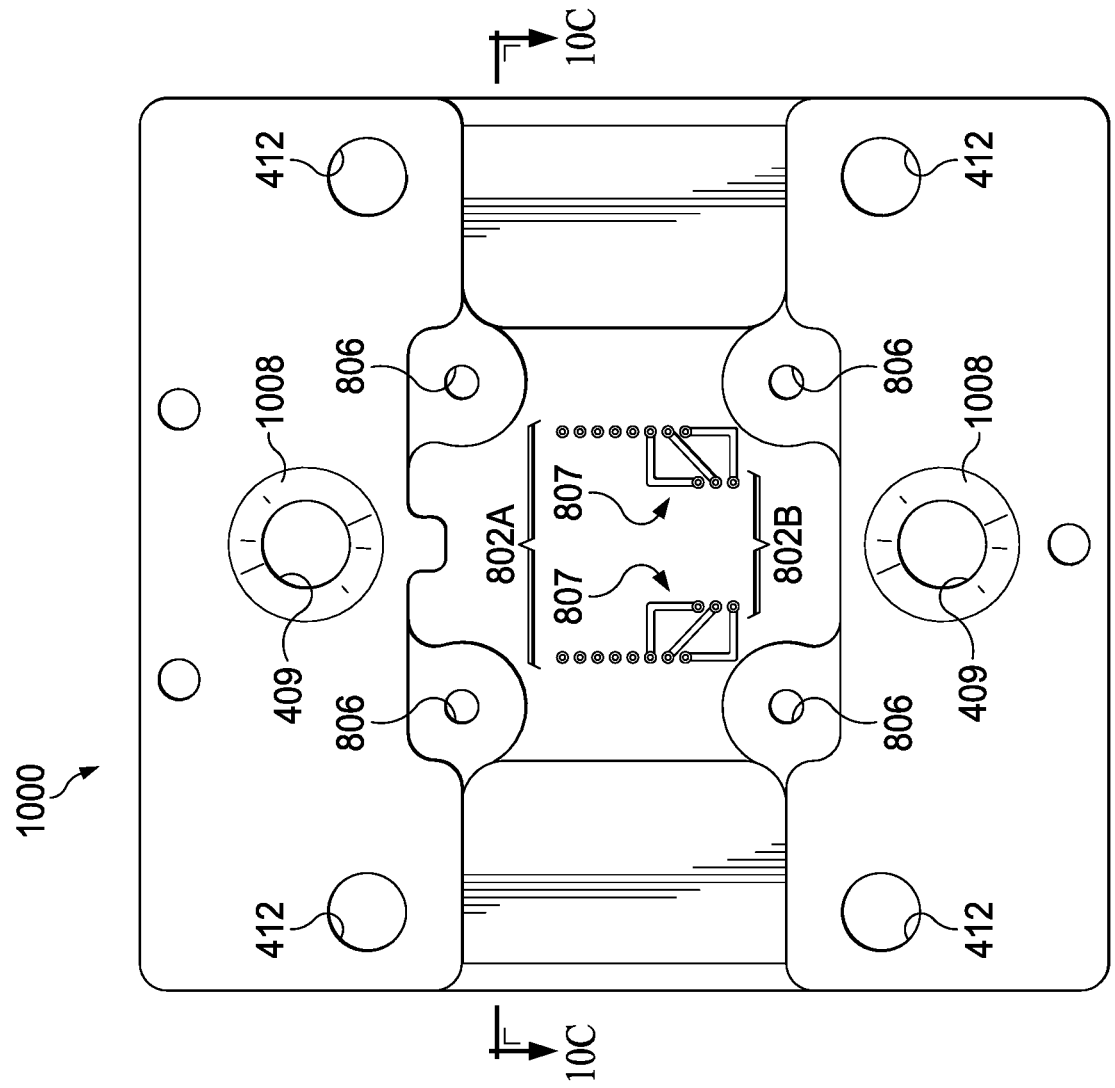
FIGS. 10A-10F show different views of a second pin retainer component for an ATE contactor adapter in accordance with various examples.
Figure 10A:
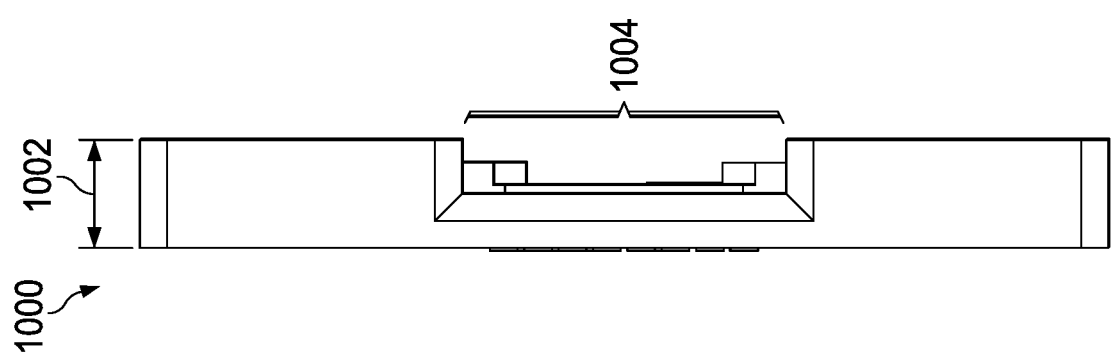

In FIG. 10B, a bottom view of the second pin retainer component 1000 is represented. The bottom view in FIG. 10B shows the side of the second pin retainer component 100 that will face and contact the first pin retainer component 900 once assembly is complete. In FIG. 10B, the sub-sets of holes 802A and 802B, the traces 807, and the screw holes 806 noted in FIG. 8A are visible. Also, the screw holes 409 and 412 noted in FIGS. 4A and 4B are visible. In addition, countersunk surfaces 1008 around the screw holes 409 are visible.

Figure 10C:
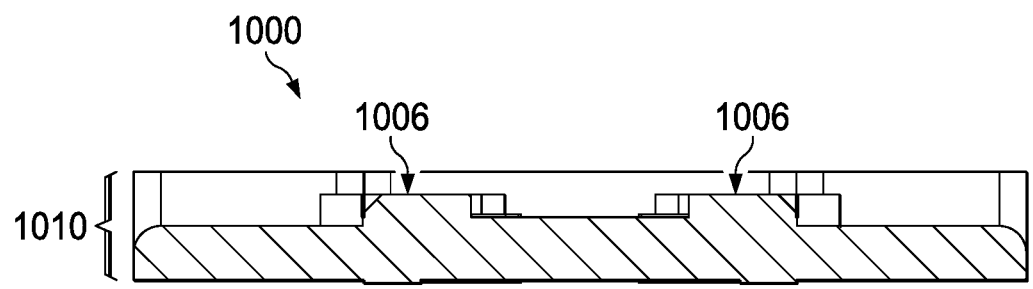

In FIG. 10C, a cross-sectional view of the second pin retainer component 1000 is represented. In FIG. 10, a thickness 1010 of the second pin retainer component 1000 in the recessed area 1004 is visible. In some examples, there are raised areas 1006 around the screw holes 806 as represented in FIG. 10C. With the recessed area 1004 and the raised areas 1006 for the second pin retainer component 1000 as well as the recessed areas 902 in the first pin retainer component 900, there is a particular fit or orientation of components to join the first pin retainer component 900 and the second pin retainer component 1000 together.

Figure 10D:
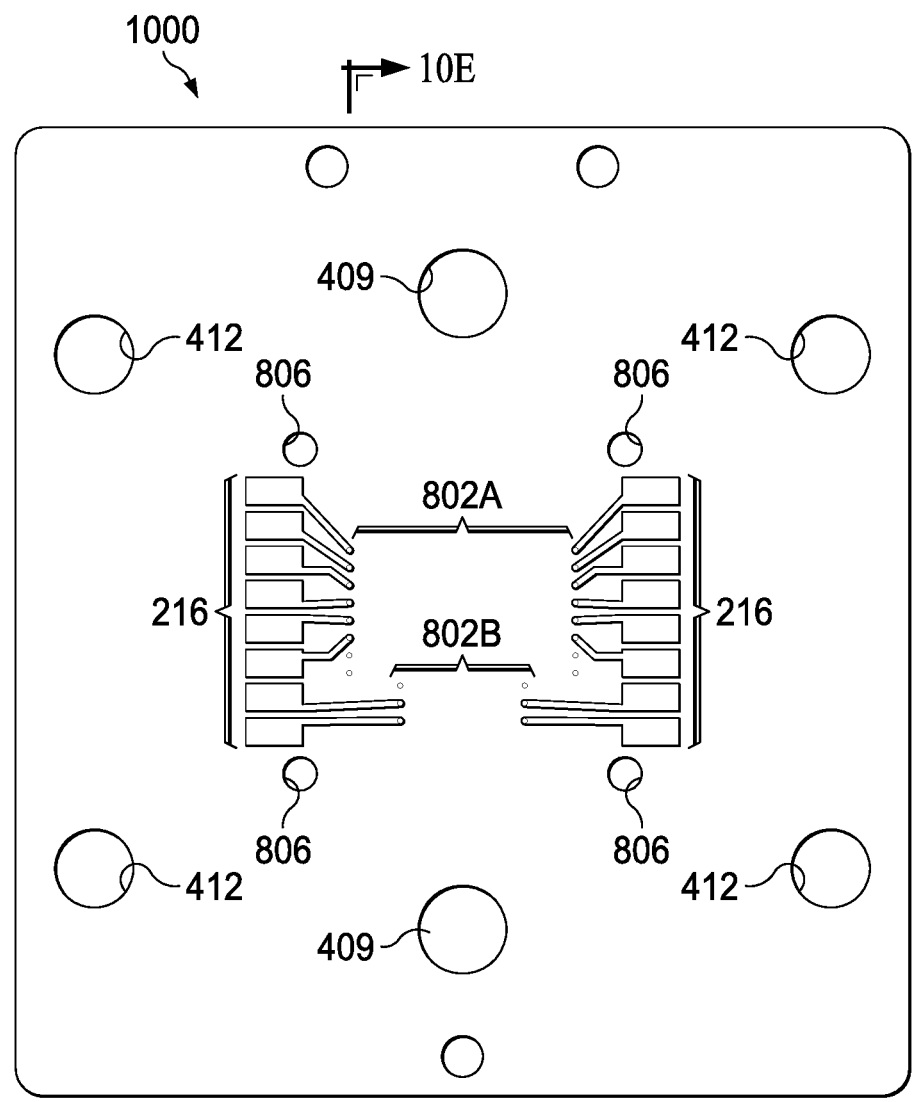

In FIG. 10D, a top view of the second pin retainer component 1000 is represented. The top view in FIG. 10D shows the side of the second pin retainer component 100 that will face away from the first pin retainer component 900 (and towards an adapter interface such as the adapter interface 220 in FIG. 2) once assembly is complete. In FIG. 10D, the sub-sets of holes 802A and 802B and the screw holes 806 noted in FIG. 8A are visible. Also, the screw holes 409 and 412 noted in FIGS. 4A and 4B are visible. Also, the set of conductive pads 216 noted in FIG. 4A is visible.

Figure 10F:
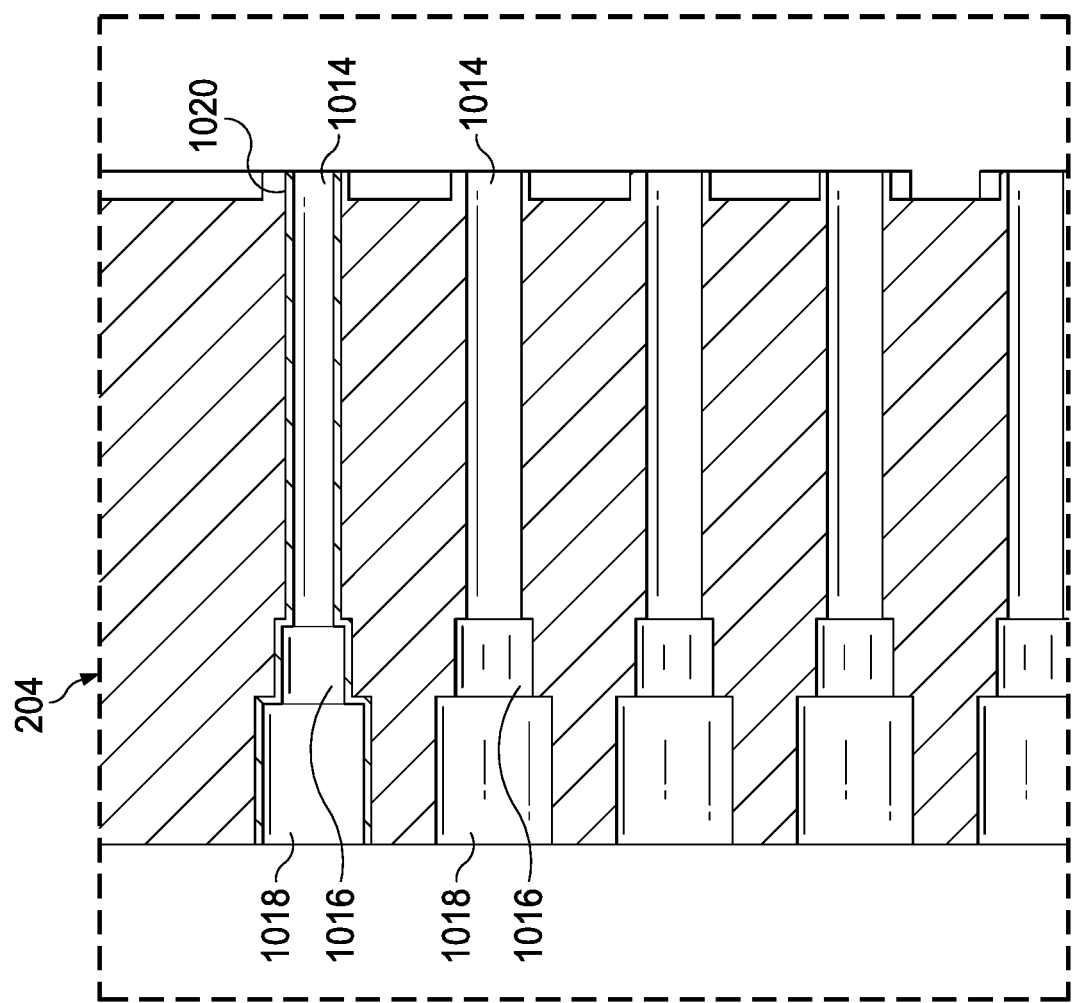
Figure 10E:
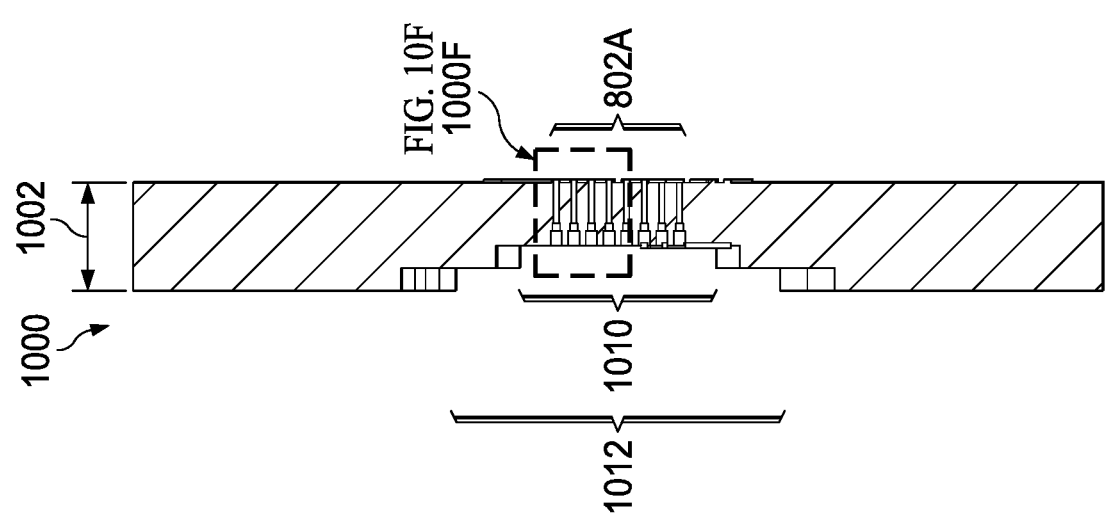

In FIG. 10E, a cross-sectional view of the second pin retainer component 1000 is represented, where the cross-section interests a row of the sub-set of holes 802A. In FIG. 10E, a first recessed area 1012 and a second recessed area 1010 are visible, where the recessed area 1010 is deeper than the recessed area 1012 relative to the default thickness 1002 for the second pin retainer component 1000. In some examples, the sub-set of holes 802A extend from the recessed area 1010 to an opposite side of the second pin retainer component (the side shown in FIG. 10D). In FIG. 10F, a more detailed cross-sectional view of some of the holes in the sub-set of holes 802A represented in FIG. 10E are shown. As shown, each hole in the sub-set of holes 802A includes a first portion 1018 with a first diameter, a second portion 116 with a second diameter, and a third portion 1014 with a third diameter. In some examples, the first diameter is greater than the second diameter, and the second diameter is greater than the third diameter. Also, in some examples, each of the hole portions 1014, 1016, and 1018 is plated with a conductive material 1020 to facilitate retention and/or electrical continuity between retained pins and conductive pads or traces (e.g., the set of conductive pads 216 visible in FIGS. 4A and 10D) of the second pin retainer component 1000.

In different examples, the dimensions of an ATE contactor adapter such as the contactor adapter 200A vary. Example dimensions for a contactor adapter body such as the contactor adapter body 202 of FIG. 2 includes side lengths between 1-2 inches (approximately 2.5 to 5 centimeters) and a width of 1/16-3/16 of an inch (approximately 1.5 to 4.5 millimeters).

Figure 11:
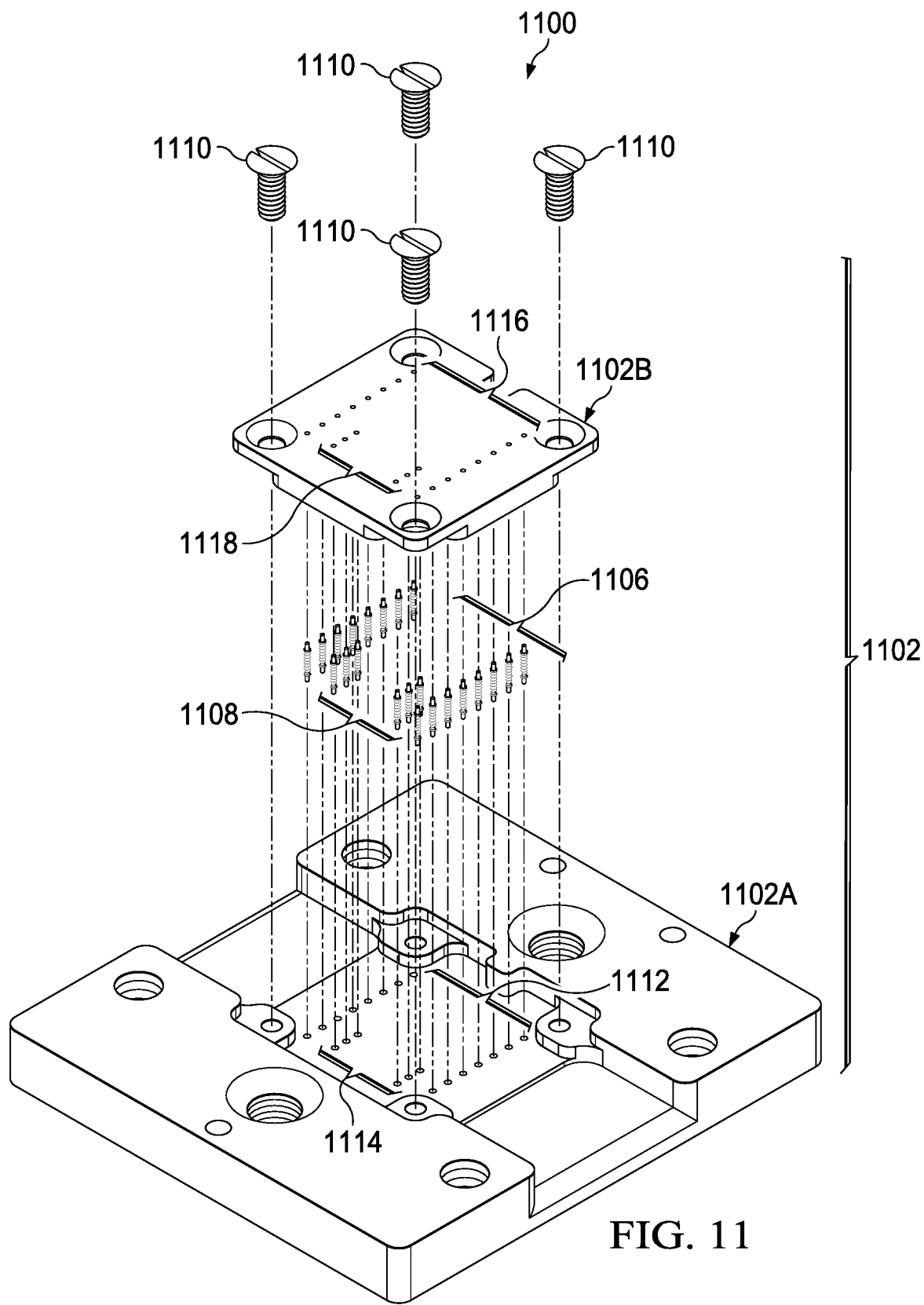
FIG. 11 shows a perspective view of components of another ATE contactor adapter before assembly in accordance with various examples.

FIG. 11 shows a perspective view of components of another ATE contactor adapter 1100 before assembly in accordance with various examples. As shown in FIG. 11, the ATE contactor adapter 1100 includes a contactor adaptor body 1102 with first component 1102A and a second component 1102B. The first component 1102A includes two sub-sets of holes 1112 and 1114. The second component 1102B also includes two sub-sets of holes 1116 and 1118. In an example assembly process for the ATE contactor adapter 1100, a sub-set of conductive pins 1106 is inserted into the sub-set of holes 1112, and another sub-set of conductive pins 1108 is inserted into the sub-set of holes 1114. The second component 1102B is then aligned with and joined with the first component 1102A using screws 1110 such that the sub-sets of conductive pins 1106 and 1108 are retained within respective sub-sets of holes (the sub-sets of holes 1112 and 1116 retain the sub-set of pins 1106, while the sub-sets of holes 1114 and 1118 retain the sub-set of conductive pins 1108) and the first and second components 1102A and 1102B are flush relative to each other or otherwise enable exposed pins protruding from the second component 11026 to contact a test board. In at least some examples, the ATE contactor adapter 1100 would include conductive pads and an adapter interface (not shown) similar to the conductive pads 216 and the adapter interface 220 represented in FIG. 2.

Figure 12:
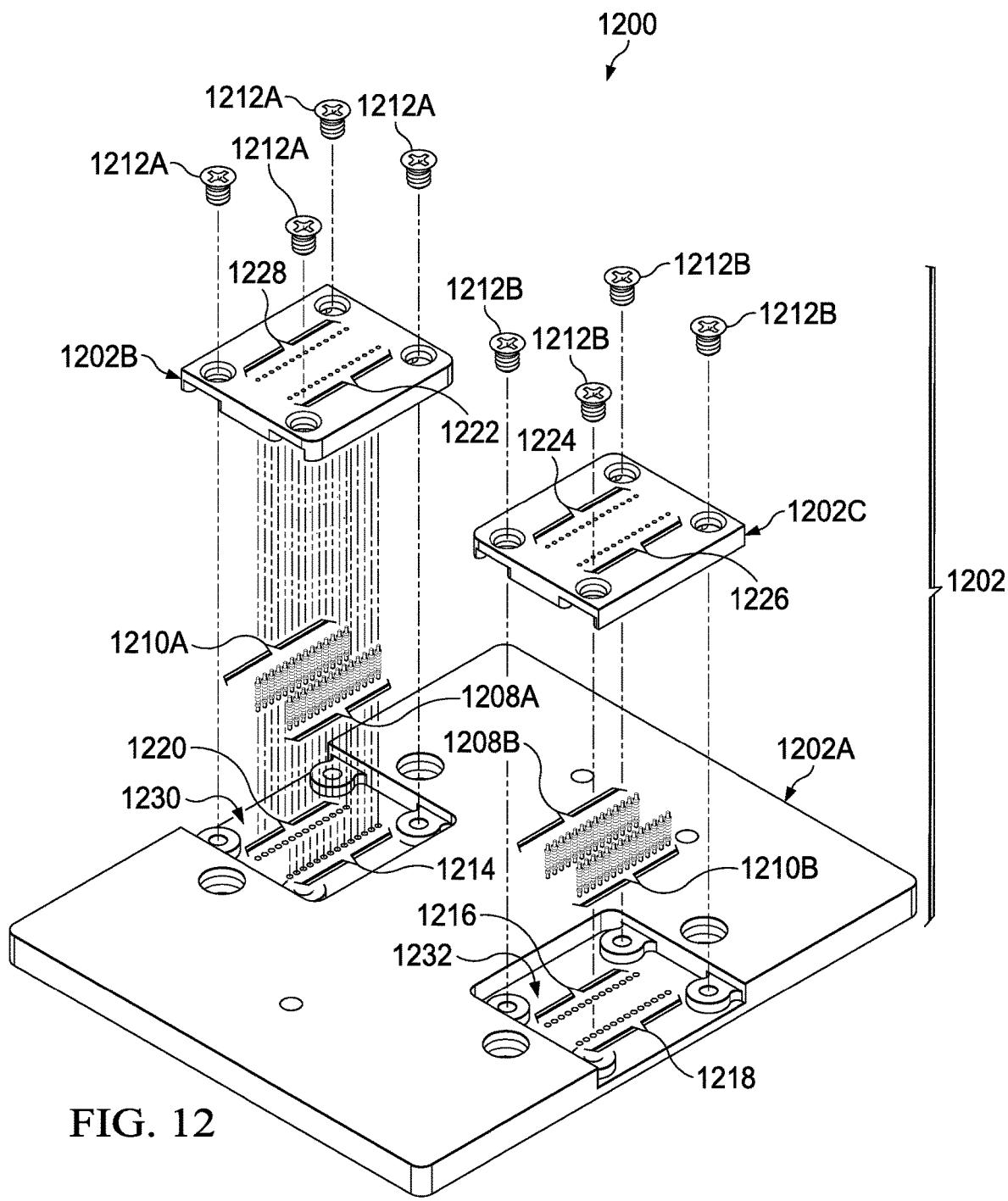
FIG. 12 shows a perspective view of components of yet another ATE contactor adapter before assembly in accordance with various examples.

FIG. 12 shows a perspective view of components of yet another ATE contactor adapter 1200 before assembly in accordance with various examples. More specifically, the ATE contactor adapter 1200 is set up for a Kelvin sensing scenario. As shown in FIG. 12, the ATE contactor adapter 1200 includes a contactor adaptor body 1202 with first component 1202A, a second component 1202B, and a third component 1202C. The first component 1102A includes four sub-sets of holes 1214, 1216, 1218, 1220, where the sub-sets of holes 1214 and 1216 are used to retain sub-sets of conductive pins 1208A, 1208B used for "force" signals in a Kelvin sensing scenario. Meanwhile, the sub-sets of holes 1218 and 1220 are used to retain sub-sets of conductive pins 1210A, 1210B used for "sense" signals in a Kelvin sensing scenario. The second component 1202B also includes sub-sets of holes 1222 and 1228, where the sub-set of holes 1228 aligns with the sub-set of holes 1220 in the first component 1202A when assembly of the ATE contactor adapter 1200 is complete, and where the sub-set of holes 1222 aligns with the sub-set of holes 1214 in the first component 1202A when assembly of the ATE contactor adapter 1200 is complete. The third component 1202C also includes sub-sets of holes 1224 and 1226, where the sub-set of holes 1224 aligns with the sub-set of holes 1216 in the first component 1202A when assembly of the ATE contactor adapter 1200 is complete, and where the sub-set of holes 1226 aligns with the sub-set of holes 1218 in the first component 1202A when assembly of the ATE contactor adapter 1200 is complete.

In an example assembly process for the ATE contactor adapter 1200, a sub-set of conductive pins 1208A is inserted into the sub-sets of holes 1214 in the first component 1202A, and another sub-set of conductive pins 1210A is inserted into the sub-set of holes 1220 in the first component 1202A. The second component 1202B is then aligned with and joined with the first component 1202A using screws 1212A such that the sub-sets of conductive pins 1208A and 1210A are retained within respective sub-sets of holes (the sub-sets of holes 1214 and 1222 retain the sub-set of conductive pins 1208A, while the sub-sets of holes 1220 and 1228 retain the sub-set of pins 1210A), and the first and second components 1202A and 1202B are flush (e.g., due to the recessed area 1230) relative to each other or otherwise enable exposed pins protruding from the second component 1202B to contact a test board.

An example assembly process for the ATE contactor adapter 1200 also includes inserting a sub-set of conductive pins 1208B into the sub-sets of holes 1216 in the first component 1202A, and inserting another sub-set of conductive pins 1210B into the sub-set of holes 1218. The third component 1202C is then aligned with and joined with the first component 1202A using screws 1212B such that the sub-sets of conductive pins 1208B and 1210B are retained within respective sub-sets of holes (the sub-sets of holes 1216 and 1224 retain the sub-set of conductive pins 1208B, while the sub-sets of holes 1218 and 1226 retain the sub-set of pins 1210B), and the first and third components 1202A and 1202C are flush (e.g., due to the recessed area 1232) relative to each other or otherwise enable exposed pins protruding from the third component 1202C to contact a test board. In at least some examples, the ATE contactor adapter 1200 would also include conductive pads and one or more adapter interfaces (not shown) similar to the conductive pads 216 and the adapter interface 220 represented in FIG. 2.

In summary, the various components represented for the ATE contactor adapter 200 of FIG. 2, the ATE contactor adapter 1100 of FIG. 11, and the ATE contactor adapter 1200 of FIG. 12 are examples only. In different examples, ATE contactor adaptors vary with regard to size, contactor adaptor bodies, test board contacts, connective networks between test board contacts and adapter interfaces, and adapter interface contacts (e.g., to couple to a PCB with a contactor for DUT operations as described herein).

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An automatic test equipment (ATE) contactor adapter compatible with at least one test board, wherein the ATE contactor adapter comprises:
a contactor adapter body having a first side and a second side, wherein the contactor adapter body comprises:
a first set of contact components disposed on the first side in an arrangement to contact conductive pads of the at least one test board;
a second set of contact components disposed on the second side and coupled to the first set of contact points; and
an adapter interface disposed on the contactor adapter body, wherein the adapter interface comprises a third set of contact components coupled to the second set of contact components, wherein the ATE contactor adapter is configured to convey signals between a device under test (DUT) and the at least one test board via the first, second, and third sets of contact components;
wherein the first set of contact components are in an arrangement to contact conductive pads of at least two different test boards with different conductive pad layouts;
wherein the arrangement includes spaced rows of contact components for each conductive pad layout, and wherein the spaced rows of contact components for each different test board are offset from each other.

2. The ATE contactor adapter of claim 1, wherein the contactor adapter body comprises first and second pieces joined together, and wherein each contact component of the first set of contact components extends through at least part of each of the first and second pieces.

3. The ATE contactor adapter of claim 2, wherein each of the first and second pieces has holes that house part of each contact component of the first set of contact components, wherein each hole has hole portions with different diameters including a hole portion with a narrower diameter that is configured to set a position of each contact component of the first set of contact components relative to the contactor adapter body.

4. The ATE contactor adapter of claim 3, wherein the holes are plated with a conductive material.

5. The ATE contactor adapter of claim 1, wherein the contactor adapter body is made from Arlon 85N.

6. The ATE contactor adapter of claim 1, wherein the second set of contact components comprises conductive pads on the second side, and wherein the third set of contact components comprises slot contacts.

7. An automatic test equipment (ATE) contactor adapter compatible with at least one test board, wherein the ATE contactor adapter comprises:
a first retainer component having a first set of holes that extend from a first side to a second side of the first retainer component;
a second retainer component having a second set of holes on a first side and a set of conductive pads on a second side of the second retainer component, wherein first and second retainer components are joined such that the second side of the first retainer component faces the first side of the second retainer component with the first and second sets of holes in alignment;
a set of conductive pins held within the first and second sets of holes in alignment, wherein the set of conductive pins couple to the set of conductive pads and is in an arrangement to contact a conductive pad layout for the at least one test board; and
an adaptor interface disposed on the second side of the second retainer component, wherein the adapter interface comprises a set of contact components coupled to the set of conductive pads, wherein the ATE contactor adapter is configured to convey signals between a device under test (DUT) and the at least one test board via the set of conductive pins, the set of conductive pads, and the set of contact components;
wherein each hole of the second set of holes has a first diameter portion and a second diameter portion, wherein the second diameter portion is smaller than the first diameter portion, wherein the second diameter portion is longer than the first diameter portion, and wherein first diameter portion is adjacent the first side of the second retainer component.

8. The ATE contactor adapter of claim 7, further comprises a tension component for each conductive pin of the set of conductive pins, where each tension component maintains a respective conductive pin in a biased position that extends beyond the first side of the first retainer component.

9. The ATE contactor adapter of claim 7, wherein each tension component comprises a spring.

10. The ATE contactor adapter of claim 7, wherein each hole of the first set of holes has a first diameter portion and a second diameter portion, wherein the second diameter portion is smaller than the first diameter portion, wherein the first diameter portion is longer than the second diameter portion, and wherein second diameter portion is adjacent the first side of the first retainer component.

11. The ATE contactor adapter of claim 7, wherein each conductive pin comprises an exposed end with multiple contact points, and wherein each conductive pin comprises an unexposed end with a conical shape.

12. The ATE contactor adapter of claim 7, wherein the set of conductive pins are in an arrangement to contact conductive pads of at least two different test boards with different conductive pad layouts, wherein the arrangement includes spaced rows of conductive pins for each conductive pad layout, and wherein the spaced rows of conductive pins for each different test board are offset from each other.

13. An automatic test equipment (ATE) contactor adapter compatible with at least one test board, wherein the ATE contactor adapter comprises:
a pin retainer;
a set of pins held by the pin retainer, wherein each pin has an exposed end and an unexposed end, wherein the exposed ends of the pins are in an arrangement to contact a conductive pad layout for the at least one test board; and
an adapter interface disposed on the pin retainer, wherein the adapter interface couples to the pins and provides contact components for a printed circuit board (PCB), wherein the ATE contactor adapter is configured to convey signals between a device under test (DUT) on a PCB and the at least one test board via the set of pins and the contact components;
wherein the set of pins are in an arrangement to contact conductive pads of at least two different test boards with different conductive pad layouts, wherein the arrangement includes spaced rows of pins for each conductive pad layout, and wherein the spaced rows of pins for each different test board are offset from each other.

14. The contactor adapter of claim 13, wherein the pin retainer comprises first and second retainer pieces made from Arlon N85.

15. The contactor adapter of claim 14, wherein each pin is held by a respective multi-diameter hole within the pin retainer.

16. The contactor adapter of claim 13, wherein the pin retainer comprises a first set of screw holes to couple the pin retainer to the adapter interface and a second set of screw holes to couple the contactor adapter to a test board.

\* \* \* \* \*